(12) United States Patent
Brust et al.

(10) Patent No.: US 9,366,965 B2
(45) Date of Patent: Jun. 14, 2016

(54) FORMING ELECTRICALLY-CONDUCTIVE PATTERNS USING CROSSLINKABLE REACTIVE POLYMERS

(71) Applicants: Thomas B. Brust, Webster, NY (US); Grace Ann Bennett, Scottsville, NY (US); Mark Edward Irving, Rochester, NY (US)

(72) Inventors: Thomas B. Brust, Webster, NY (US); Grace Ann Bennett, Scottsville, NY (US); Mark Edward Irving, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 142 days.

(21) Appl. No.: 14/457,396

(22) Filed: Aug. 12, 2014

(65) Prior Publication Data

US 2016/0048078 A1 Feb. 18, 2016

(51) Int. Cl.
*G03F 7/20* (2006.01)
*G03F 7/16* (2006.01)
*G03F 7/038* (2006.01)
*G03F 7/004* (2006.01)

(52) U.S. Cl.
CPC ............... *G03F 7/16* (2013.01); *G03F 7/0045* (2013.01); *G03F 7/0382* (2013.01); *G03F 7/0388* (2013.01)

(58) Field of Classification Search
CPC ....... G03F 7/0388; G03F 7/16; G03F 7/0045; G03F 7/0382
USPC .......... 430/16, 18, 285.1, 270.1, 324
See application file for complete search history.

(56) References Cited

U.S. PATENT DOCUMENTS

| 3,137,668 | A | 6/1964 | Kuppers | |
|---|---|---|---|---|
| 2007/0246249 | A1 | 10/2007 | Kano et al. | |
| 2015/0140285 | A1* | 5/2015 | Irving | C23C 18/1608 428/195.1 |
| 2015/0140483 | A1* | 5/2015 | Irving | G03F 7/2002 430/18 |

FOREIGN PATENT DOCUMENTS

| EP | 0 773 478 A1 | 5/1997 |
|---|---|---|
| JP | 2013-028772 * | 2/2013 |

OTHER PUBLICATIONS

Computer-generated translation of JP 2013-028772 (JP '772).*
"A Trifluoroacetic Acid-labile Sulfonate Protecting Group and Its Use in the Synthesis of a Near-IR Fluorophore," Steven M. Pauff et al., The Journal of Organic Chemistry, 2013, 78, pp. 711-716.
"Design and application of esterase-labile sulfonate protecting groups," Laert Rusha et al., The Royal Society of Chemistry, 2011, 47, pp. 2038-2040.
"Profiling Sulfonate Ester Stability: Identification of Complementary Protecting Groups for Sulfonates," Stephen C. Miller, The Journal of Organic Chemistry, 2010, 75, pp. 4632-4635.

* cited by examiner

*Primary Examiner* — John A McPherson
(74) *Attorney, Agent, or Firm* — J. Lanny Tucker

(57) ABSTRACT

An electrically-conductive pattern is prepared using a reactive composition having: (1) a reactive polymer; (2) a compound that provides a cleaving acid upon exposure to radiation; and (3) a crosslinking agent that reacts in the presence of the cleaving acid, to provide crosslinking in the reactive polymer. A polymeric layer of the reactive composition is patternwise exposed to provide a polymeric layer comprising non-exposed regions and exposed regions comprising a polymer comprising sulfonic acid or sulfonate groups. The exposed regions are contacted with electroless seed metal ions to form a pattern of electroless seed metal ions, which pattern is reduced to provide a pattern of corresponding electroless seed metal particles. Electrolessly plating is then carried out in the exposed regions. The unique reactive comprises (a) recurring units represented Structure (A) as described in the disclosure, and can also include other recurring units that are crosslinkable or provide other properties.

18 Claims, No Drawings

FORMING ELECTRICALLY-CONDUCTIVE PATTERNS USING CROSSLINKABLE REACTIVE POLYMERS

RELATED APPLICATIONS

Reference is made to the following copending and commonly assigned patent applications, the disclosures of which are incorporated herein by reference:

U.S. Ser. No. 14/084,675 that was filed Nov. 20, 2013 by Wexler, Bennett, and Lindner;

U.S. Ser. No. 14/084,693 that was filed Nov. 20, 2013 by Irving, Wexler, Bennett, and Lindner;

U.S. Ser. No. 14/084,711 that was filed Nov. 20, 2013 by Wexler, Bennett, and Lindner;

U.S. Ser. No. 14/071,765 that was filed Nov. 5, 2013 by Brust, Irving, and Falkner;

U.S. Ser. No. 14/071,879 that was filed Nov. 5, 2013 by Brust, Irving, Falkner, and Wyand; and U.S. Ser. No. 14/457,477 filed on even date herewith by Brust, Bennett, and Irving and entitled "Crosslinkable Polymers".

FIELD OF THE INVENTION

This invention relates to a method for forming patterns of a reactive polymer that can be used for forming other material patterns such as electrically-conductive metallic patterns, for example using electroless plating. The invention is carried out using crosslinkable reactive polymers containing pendant blocked sulfonate groups, which reactive polymer can be crosslinked and patternwise switched from hydrophobic to hydrophilic nature upon suitable irradiation. This invention also relates to precursor, intermediate, and product articles related to the inventive method.

BACKGROUND OF THE INVENTION

In recent decades accompanying rapid advances in information-oriented society, there have also been rapid technological advances to provide devices and systems for gathering and communicating information. Of these, display devices have been designed for television screens, commercial signage, personal and laptop computers, personal display devices, and phones of all types, to name the most common information sharing devices.

As the increase in the use of such devices has exploded in frequency and necessity by displacing older technologies, there has been a concern that electromagnetic radiation emission from such devices may cause harm to the human body or neighboring devices or instruments over time. To diminish the potential effects from the electromagnetic radiation emission, display devices are designed with various transparent conductive materials that can be used as electromagnetic wave shielding materials.

In display devices where a continuous conductive film is not practical for providing this protection from electromagnetic radiation emission, it has been found that conductive mesh or patterns can be used for this electromagnetic wave shielding purpose.

Other technologies have been developed to provide new microfabrication methods to provide metallic, two-dimensional, and three-dimensional structures with conductive metals. Patterns have been provided for these purposes using photolithography and imaging through mask materials.

In addition, as the noted display devices have been developed in recent years, attraction has increased greatly for the use of touch screen technology whereby a light touch on a transparent screen surface with a finger or stylus can create signals to cause changes in screen views or cause the reception or sending of information, telecommunications, interaction with the internet, and many other features that are being developed at an ever-increasing pace of innovation. The touch screen technology has been made possible largely by the use of transparent conductive grids on the primary display so that the location of the noted touch on the screen surface can be detected by appropriate electrical circuitry and software.

For a number of years, touch screen displays have been prepared using indium tin oxide (ITO) coatings to create arrays of capacitive patterns or areas used to distinguish multiple point contacts. ITO can be readily patterned using known semiconductor fabrication methods including photolithography and high vacuum processing. However, the use of ITO coatings has a number of disadvantages. Indium is an expensive rare earth metal and is available in limited supply. Moreover, ITO is a ceramic material and is not easily bent or flexed and such coatings require expensive vacuum deposition methods and equipment. In addition, ITO conductivity is relatively low, requiring short line lengths to achieve desired response rates (upon touch). Touch screens used in large displays are broken up into smaller segments in order to reduce the conductive line length to provide acceptable electrical resistance. These smaller segments require additional driving and sensing electronics, further adding to the cost of the devices.

Silver is an ideal conductor having conductivity that is 50 to 100 times greater than that of ITO. Unlike most metal oxides, silver oxide is still reasonably conductive and its use reduces the problem of making reliable electrical connections. Moreover, silver is used in many commercial applications and is available from numerous commercial sources.

In other technologies, transparent polymeric films have been treated with conductive metals such as silver, copper, nickel, and aluminum by such methods as sputtering, ion plating, ion beam assist, wet coating, as well as the vacuum deposition. However, all of these technologies are expensive, tedious, or extremely complicated so that the relevant industries are spending considerable resources to design improved means for forming conductive patterns for various devices especially touch screen displays.

A similar level of transparency and conductivity for patterns can be achieved by producing very fine lines of about 5-6 μm in width of highly conductive material such as copper or silver metal or conductive polymers.

Polymers that can be patternwise switched from hydrophobic nature to hydrophilic nature are known for various uses such as making lithographic printing plates, and such polymers typically comprise carboxylic acid, alcohol, or amine functionality that can be initially attached or "protected" by a chemical protective group that renders it hydrophobic and relatively non-reactive. These protecting groups can be removed with specific chemical triggers such as ultraviolet irradiation, a strong acid, or basic conditions and heat. Catalytic acids can be generated by UV light using a wide variety of photoacid generating compounds such as sulfonium or iodonium salts. Once the protecting groups are detached or removed, the carboxylic acid, alcohol, or amine functionality can be available to provide hydrophilicity and to be available for other purposes.

Polymers containing pendant sulfonate groups rather than carboxylic acid, alcohol, or amine groups could be useful because of the high acidity or low pKa and high stability of the resulting pendant sulfonic acid group, making it highly ionized under a wide range of conditions. However, the "protection" of sulfonate groups is known to be a problem because of the tendency for sulfonate esters to be very reactive, making any "protecting" group unstable to a wide variety of chemical reagents and conditions and thus ineffective. Alternatively, the protected sulfonate-containing polymer could readily degrade under normal environmental conditions such as humidity and heat.

The literature relating to sulfonate "protecting" group technology provides so assistance for this problem. Some limited success has been reported from use of hindered alcohols such as neopentyl, cyclopentyl, methyl tetrahydropyranyl alcohols. Beta-halo alcohols having electron withdrawing groups, especially beta-fluoro alcohols that destabilize the transition state of the deprotection step (thus making the protected sulfonate more stable) have also been reported to function under some conditions. The fluorinated benzyl alcohol, α-(trifluoromethyl)benzyl alcohol has been described as showing some possible use as sulfonate protecting group. See, for example, Pauff and S. C. Miller, *Journal of Organic Chemistry*, 2013, 78, 711-716; L. Rusha and S. C. Miller, *Chem. Commun.*, 2011, 47, 2038-2040; S. C. Miller, *Journal of Organic Chemistry*, Vol. 75, No. 13, 2010.

While there are some known reactive polymers that can be used to provide electrically-conductive patterns, there is a need for a way to make reactive polymer patterns that can be used for producing thin electrically-conductive lines using less expensive materials and electroless plating techniques in order to achieve a substantial improvement in cost, reliability, and availability of electrically-conductive patterns for various display devices. Moreover, it would be desirable in some applications to use reactive polymers having "protected" pendant sulfonate groups. The present invention addresses this need as described in considerable detail below.

SUMMARY OF THE INVENTION

The present invention addresses problems noted above, which invention a method for forming a pattern in a polymeric layer, the method comprising:

providing a polymeric layer comprising a reactive composition that comprises:

(1) a reactive polymer comprising (a) recurring units in an amount of at least 10 mol % based on the total reactive polymer recurring units;

(2) a compound that provides a cleaving acid upon exposure to radiation having a $\lambda_{max}$ of at least 150 nm and up to and including 450 nm, which cleaving acid has a $pK_a$ of 2 or less as measured in water;

(3) a crosslinking agent that is capable of reacting in the presence of the cleaving acid, to provide crosslinking in the reactive polymer; and (4) optionally, a photosensitizer, patternwise exposing the polymeric layer to radiation having a $\lambda_{max}$ of at least 150 nm and up to and including 450 nm, to provide a polymeric layer comprising non-exposed regions and exposed regions comprising a polymer comprising pendant sulfonic acid groups (or sulfonate groups), optionally heating the polymeric layer simultaneously with or after patternwise exposing the polymeric layer but before contacting the exposed regions of the polymeric layer with electroless seed metal ions, at a temperature sufficient to further generate sulfonic acid groups (or sulfonate groups) in the reactive polymer in the exposed regions of the polymeric layer, contacting the exposed regions of the polymeric layer with electroless seed metal ions to form a pattern of electroless seed metal ions in the exposed regions of the polymeric layer, reducing the pattern of electroless seed metal ions to provide a pattern of corresponding electroless seed metal particles in the exposed regions of the polymeric layer, and electrolessly plating the corresponding electroless seed metal particles in the exposed regions of the polymeric layer with a metal that is the same as or different from the corresponding electroless seed metal particles, wherein the reactive polymer comprises (a) recurring units represented by the following Structure (A):

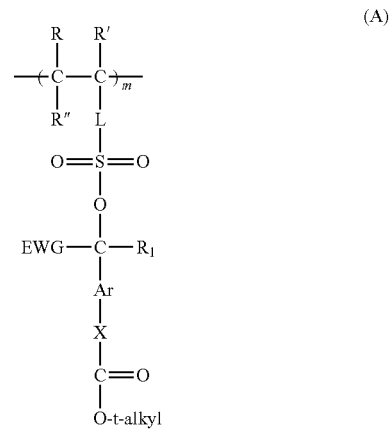

wherein:
R, R', and R" are independently hydrogen or an alkyl, cyano, or halo group,
$R_1$ is hydrogen or a halo, substituted or unsubstituted alkyl, substituted or unsubstituted cycloalkyl, alkoxy, cyano, hydroxy, carboxy, or ester group,
L is an organic linking group,
EWG represents an electron withdrawing group having a Hammett-sigma value greater than or equal to 0.35 such that the oxygen-carbon bond in O—C(EWG)($R_1$) is cleavable in the presence of a cleaving acid having a $pK_a$ of 2 or less as measured in water,
Ar is a substituted or unsubstituted arylene group,
X is $NR_2$ or oxygen,
$R_2$ is hydrogen or an alkyl group,
t-alkyl represents a tertiary alkyl group having 4 to 6 carbon atoms, and
m represents at least 10 mol % and up to and including 99 mol %, based on the total recurring units in the polymer.

In some embodiments, the method of this invention further comprises:

heating the polymeric layer simultaneously or immediately after patternwise exposing the polymeric layer at a temperature sufficient to further generate sulfonic acid groups (or sulfonate groups) in the reactive polymer in the exposed regions of the polymeric layer.

To use the method of this invention, a precursor article is provided, this precursor article comprising a substrate and having disposed thereon a polymeric layer comprising a reactive composition that comprises:

(1) a reactive polymer comprising (a) recurring units in an amount of at least 10 mol % based on the total reactive polymer recurring units;

(2) a compound that provides a cleaving acid upon exposure to radiation having a $\lambda_{max}$ of at least 150 nm and up to and including 450 nm, which cleaving acid has a $pK_a$ of 2 or less as measured in water;

(3) a crosslinking agent that is capable of reacting in the presence of the cleaving acid, to provide crosslinking in the reactive polymer; and (4) optionally, a photosensitizer, wherein the reactive polymer comprises (a) recurring units represented by the Structure (A) described herein.

Moreover, an intermediate article is provided by the method of this invention, which intermediate article comprises a substrate and has disposed thereon a polymeric layer comprising exposed regions and non-exposed regions, the exposed regions comprising a pattern of polymer comprising pendant sulfonic acid groups, which polymer has been derived from a reactive polymer comprising (a) recurring units, and the non-exposed regions comprising a reactive composition that comprises:

(1) the reactive polymer comprising (a) recurring units in an amount of at least 10 mol % based on the total reactive polymer recurring units;

(2) a compound that provides a cleaving acid upon exposure to radiation having a $\lambda_{max}$ of at least 150 nm and up to and including 450 nm, which cleaving acid has a $pK_a$ of 2 or less as measured in water;

(3) a crosslinking agent that is capable of reacting in the presence of the cleaving acid, to provide crosslinking in the reactive polymer; and (4) optionally, a photosensitizer, wherein the reactive polymer comprises (a) recurring units represented by Structure (A) described herein.

In addition, an intermediate article comprises a substrate and has disposed thereon a polymeric layer comprising exposed regions and non-exposed regions, the exposed regions comprising a pattern of electroless seed metal ions complexed within a polymer comprising pendant sulfonic acid groups (or sulfonate groups), which polymer has been derived from a reactive polymer, and the non-exposed regions comprising a reactive composition that comprises:

(1) the reactive polymer comprising (a) recurring units in an amount of at least 10 mol % based on the total reactive polymer recurring units;

(2) a compound that provides a cleaving acid upon exposure to radiation having a $\lambda_{max}$ of at least 150 nm and up to and including 450 nm, which cleaving acid has a $pK_a$ of 2 or less as measured in water;

(3) a crosslinking agent that is capable of reacting in the presence of the cleaving acid, to provide crosslinking in the reactive polymer; and (4) optionally, a photosensitizer, wherein the reactive polymer comprises (a) recurring units represented by the Structure (A) described herein.

Moreover, an intermediate article provided by the present invention comprises a substrate and has disposed thereon a polymeric layer comprising exposed regions and non-exposed regions, the exposed regions comprising a pattern of electroless seed metal particles complexed within a polymer comprising pendant sulfonic acid groups (or sulfonate groups), which polymer has been derived from a reactive polymer, and the non-exposed regions comprising a reactive composition that comprises:

(1) the reactive polymer comprising (a) recurring units in an amount of at least 10 mol % based on the total reactive polymer recurring units;

(2) a compound that provides a cleaving acid upon exposure to radiation having a $\lambda_{max}$ of at least 150 nm and up to and including 450 nm, which cleaving acid has a $pK_a$ of 2 or less as measured in water;

(3) a crosslinking agent that is capable of reacting in the presence of the cleaving acid, to provide crosslinking in the reactive polymer; and (4) optionally, a photosensitizer, wherein the reactive polymer comprises (a) recurring units represented by the Structure (A) described herein.

In addition, the present invention provides a product article comprising a substrate and having disposed thereon a polymeric layer comprising exposed regions and non-exposed regions, the exposed regions comprising a pattern of electrolessly plated metal complexed within or deposited on the surface of a polymer comprising pendant sulfonic acid groups (or sulfonate groups), which polymer has been derived from a reactive polymer, and the non-exposed regions comprising a reactive composition that comprises:

(1) the reactive polymer comprising (a) recurring units in an amount of at least 10 mol % based on the total reactive polymer recurring units;

(2) a compound that provides a cleaving acid upon exposure to radiation having a $\lambda_{max}$ of at least 150 nm and up to and including 450 nm, which cleaving acid has a $pK_a$ of 2 or less as measured in water;

(3) a crosslinking agent that is capable of reacting in the presence of the cleaving acid, to provide crosslinking in the reactive polymer; and (4) optionally, a photosensitizer, wherein the reactive polymer comprises (a) recurring units represented by the Structure (A) described herein.

The present invention provides fine conductive metal lines without using traditional high-cost semiconductor fabrication methods. It is possible to obtain these advantages because of the use of a unique reactive polymer that can be reacted in the presence of a strong acid to provide a sulfonic acid groups to which metal ions can be complexed, while other moieties in the reactive polymer can provide crosslinking capability.

The unique reactive polymers provide these advantages and others as they can become water-insoluble in the exposed regions of a polymeric layer, and a water-permeable but water-insoluble pattern can be formed on a suitable substrate. Reactive polymer (and reactive composition) in the non-exposed regions can be readily washed away, if desired, using a suitable solvent. The remaining metal-complexing and crosslinked polymer can then be treated with a catalytic metal ion bath such as silver nitrate where the metal ions will complex with the sulfonic acid, sulfonate, or other metal ion complexing or reactive groups in the crosslinked polymer. These complexed metal ions can then be reduced in a suitable reducing bath to form catalytic metal particles suitable for electroless metal plating of a variety of metals as described below. The UV radiation initiated crosslinking in the exposed regions forming the desired predetermined pattern is sufficient to keep the pattern from not dissolving in the electroless metal plating baths, while still allowing reactants and products of the electroless plating process to diffuse in and out of the crosslinked polymer pattern.

The present invention therefore can be used to produce highly conductive metal patterns that exhibit high fidelity or correspondence to the ultraviolet radiation exposing pattern including the ability to easily produce 5 to 6 urn wide (or less) electrically-conductive metal lines that exhibit high electrical conductivity (low resistivity).

The reactive polymers can include an unique version of an 4-acetoxy(α-trifluoromethyl)benzyl (ATFMB) alcohol "protecting" group to pattern-wise switch from a non-complexing hydrophobic form to a highly complexing hydrophilic form containing a high concentration of sulfonic acid groups or sulfonate groups. This improvement is accomplished by replacing the typical 4-acetoxy group with a t-alkoxycarbonyloxy group to produce a new "protecting" group and by utilizing a strong acid generating molecule such as a sulfonium or iodonium salt to trigger the removal of the "protecting" group which then triggers a quinone-methide reaction to de-protect the pendant sulfonic acid groups (or sulfonate groups if neutralization occurs) in the crosslinked polymer. The protected pendant sulfonate groups should be much more stable to environmental conditions because a strong acid ($pK_a$ of 2 or less) is needed to trigger such removal of (cleaving off) the "protective" group to initiate the formation of the pendant sulfonic acid groups or sulfonate groups.

As a result, a stable but acid-switchable reactive polymer can be used to provide pendant sulfonic acid groups or sulfonate groups during imagewise exposure in the presence of a strong acid, followed by appropriate functional pattern generation. The functional patterns can then be further used to make electrically-conductive patterns using various conductive metals.

DETAILED DESCRIPTION OF THE INVENTION

The following discussion is directed to various embodiments of the present invention and while some embodiments can be more desirable for specific uses, the disclosed embodiments should not be interpreted or otherwise considered to limit the scope of the present invention, as claimed below. In addition, one skilled in the art will understand that the following disclosure has broader application than is explicitly described and the discussion of any embodiment.

Definitions

As used herein to define various components of the reactive compositions, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term's definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a composition, formulation, or layer. Unless otherwise indicated, the percentages can be the same for either a dry layer or pattern, or for the total solids of the formulation or composition.

The term "homopolymer" is meant to refer to polymeric materials that have the same repeating or recurring unit along a polymer backbone. The term "copolymer" refers to polymeric materials composed of two or more different repeating or recurring units that are arranged in any order (randomly or otherwise) along the polymer backbone.

For the reactive polymers used in the present invention, the various recurring units can be arranged randomly along the polymer backbone, or there can be blocks of recurring units that occur naturally during the polymerization process.

Recurring units in the reactive polymers described herein are generally derived from the corresponding ethylenically unsaturated polymerizable monomers used in a polymerization process, which ethylenically unsaturated polymerizable monomers have the desired functional and pendant groups. Alternatively, desired pendant groups can be incorporated within recurring units after polymerization of ethylenically unsaturated polymerizable monomers by reaction with requisite precursor pendant groups.

The term "reactive polymer" is used herein to refer to the polymers described below that have the essential components and properties described and can be used in the methods of the present invention to form electrically-conductive patterns.

By "solubility or dispersibility" in reference to the reactive polymer, we mean that a uniform stable solution or dispersion of reactive polymer can be prepared using a desired solvent at a solids concentration that is useful for use in the present invention, for example preparation of coating formulations.

The term "aqueous-based" refers to solutions, baths, or dispersions in which the predominant solvent, or at least 50 weight % of the solvents, is water.

Unless otherwise indicated, the term "mol %" when used in reference to recurring units in reactive polymers, refers to either the nominal (theoretical) amount of a recurring unit based on the molecular weight of ethylenically unsaturated polymerizable monomer used in the polymerization process, or to the actual amount of recurring unit in the resulting reactive polymer as determined using suitable analytical techniques and equipment.

Uses

The materials and methods described or claimed herein can be used to provide reactive polymer patterns that can be used as patterned substrates for further chemical reactions such as the formation of catalytic metal particles or nano-particles that can then be used to form electrically-conductive metal patterns as described herein, which electrically-conductive metal patterns can be incorporated into various devices including but not limited to touch screen or other display devices.

For example, the reactive compositions described herein can be used for a variety of purposes where efficient photopolymerization and metal pattern formation is needed in various articles or devices. Such reactive compositions must be sensitive to a chosen radiation wavelength as noted above. For example, the reactive compositions can be used in various methods that can provide electrically-conductive metal patterns, for example using electroless plating procedures, which electrically-conductive metal patterns can be incorporated into various devices including but not limited to, touch screen or other display devices that can be used in numerous industrial, consumer, and commercial products.

Touch screen technology can comprise different touch sensor configurations including capacitive and resistive touch sensors. Capacitive touch sensors can be used in electronic devices with touch-sensitive features. These electronic devices can include but are not limited to, televisions, monitors, and projectors that can be adapted to display images including text, graphics, video images, movies, still images, and presentations. The image devices that can be used for these display devices that can include cathode ray tubes (CRT), projectors, flat panel liquid crystal displays (LCD), light emitting diode (LED) systems, organic light emitting diode (OLED) systems, plasma systems, electroluminescent displays (ELD), and field emission displays (FED). For example, the present invention can be used to prepare capacitive touch sensors that can be incorporated into electronic devices with touch-sensitive features to provide computing devices, computer displays, portable media players including e-readers, mobile telephones and other communicating devices.

Systems and methods of fabricating flexible and optically compliant touch sensors in a high-volume roll-to-roll manufacturing process wherein micro electrically-conductive features can be created in a single pass are possible using the present invention. The reactive compositions can be used in such systems and methods with multiple printing members to form multiple high resolution electrically-conductive images from predetermined designs of patterns provided in those multiple printing members. Multiple patterns can be printed on one or both sides of a substrate. For example, one predetermined pattern can be printed on one side of the substrate and a different predetermined pattern can be printed on the opposing side of the substrate. The printed patterns of the photopolymerizable compositions can then be further processed to provide electrically-conductive metal patterns using electroless metal plating.

Reactive Polymers for Pattern Formation

In general, the reactive polymers useful in the practice of this invention have two essential features: (1) they have labile groups that upon exposure to suitable radiation-induced acids are de-blocked and provide hydrophilic sulfonic acid (or sulfonate groups if neutralization occurs), and (2) upon such irradiation, they are capable of being crosslinked only in exposed regions. While the reactive polymers can be supplied as solutions in appropriate solvents, they are best used when applied to a substrate that can have a large or small surface, including the outer surfaces or inorganic or organic particles and then dried.

The reactive polymers are generally vinyl polymers having a carbon-carbon backbone and suitable pendant groups as described below. These vinyl polymers are derived from one or more ethylenically unsaturated polymerizable monomers using suitable polymerization procedures including solution or emulsion polymerization techniques using appropriate initiators, surfactants, catalysts, and solvents, all of which would be readily apparent to one skilled in the art from the teaching provided herein. Specific types of recurring units described herein can be provided in the reactive polymer in random fashion (no blocks or recurring units formed purposely) along the reactive polymer backbone, or there can be blocks of a specific type or types of recurring units along the reactive polymer backbone.

The useful reactive polymers comprise at least some recurring units that comprise pendant groups attached the polymer backbone, which pendant groups comprise a labile group that can provide the sulfonic acid groups (described below). The term "labile" means that these groups can provide pendant sulfonic acid groups upon deblocking when the reactive composition described herein is exposed to a strong acid generated by decomposition of a photoacid generator that has been exposed to radiation having $\lambda_{max}$ of at least 150 nm and up to and including 450 nm, or more likely exposed to radiation having a $\lambda_{max}$ of at least 150 nm and up to and including 330 nm (sometimes known as "short UV"). Prior to the noted irradiation (and optional heating described below), the labile groups are considered "blocked" or "protected" and are not available for reaction or causing reaction.

The reactive polymers useful in the present invention can become de-blocked to form pendant sulfonic acid groups during the generation of the cleaving acid (described below). Such crosslinking does not require the presence of distinct or separate crosslinking agents within the polymeric layer (described below), but they can be provided if desired. Depending upon the pH of the medium containing the de-blocked polymer, some or all of the pendant sulfonic acid groups can become neutralized to form pendant sulfonate groups. A skilled worker would appreciate when this might occur for a given reactive polymer and reactive composition.

The most useful reactive polymers are vinyl (addition) polymers comprising (a) recurring units that are represented by Structure (A) as described below.

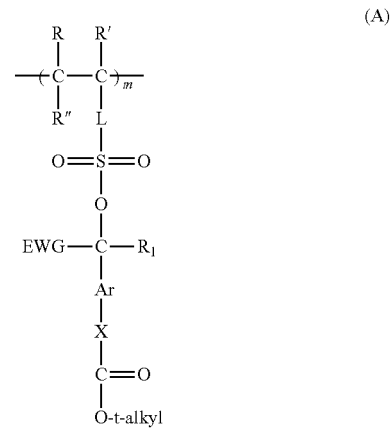

(A)

In Structure (A), R, R', and R" are independently hydrogen or an alkyl, cyano, or halo group. Such alkyl groups can be substituted or unsubstituted and typically have 1 to 6 carbon atoms, or more likely 1 to 3 carbon atoms. Most likely, R, R', and R" are independently hydrogen, methyl, ethyl, or chloro. In most embodiments, R, R', and R" can independently be hydrogen or methyl.

Additionally in Structure (A), $R_1$ is hydrogen or a substituted or unsubstituted alkyl group (including linear, branched, or cyclic groups including various isomers) having 1 to 10 carbon atoms, including but not limited to chloro-, fluoro-, cyano-, nitro-, carboxy-, hydroxy-, alkoxy-, and amino-substituted alkyl groups. In addition $R_1$ can be substituted or unsubstituted cycloalkyl groups having 5 to 10 carbon atoms in the ring, including but not limited to chloro-, fluoro-, cyano-, nitro-, carboxy-, hydroxy-, alkoxy-, and amino-substituted cycloalkyl groups. Moreover, $R_1$ can be selected from halo (fluoro or chloro), cyano, alkoxy having 1 to 6 carbon atoms, hydroxy, carboxy, and alkyl or aryl ester groups having a suitable number of carbon atoms. More likely, $R_1$ is a substituted or unsubstituted alkyl group having 1 to 6 carbon atoms (including linear or branched non-cyclic groups) including halo-substituted alkyl groups. Most $R_1$ groups are hydrogen, methyl, ethyl, or substituted methyl groups such as halo-substituted methyl groups.

L in Structure (A) is an organic linking group comprising one or more aliphatic groups that generally include 1 to 10 carbon, nitrogen, or oxygen atoms in the chain and can include one or more alkylene groups (including linear, branched, or cyclic alkylene groups) connected or interrupted with hetero atom groups such as oxy, carbonyl, carbonyloxy, amino, or amido groups. In most embodiments, L comprises a combination of 1 to 10 carbon and oxygen atoms that can include one or more alkylene groups and a carbonyloxy group. For example, L can be a carbonyloxyalkylene group having 1 to 10 carbon atoms in the substituted or unsubstituted alkylene chain such as a methylene or ethylene chain. L can also be a substituted or unsubstituted arylene groups such as a substituted phenylene group derived from a styrene monomer.

In Structure (A), EWG represents an electron withdrawing group having a Hammett-sigma value greater than or equal to 0.35 such that the oxygen-carbon bond in O—C(EWG)(R$_1$) is cleavable in the presence of a cleaving acid having a pK$_a$ of 2 or less as measured in water. A skilled worker would be able to determine which chemical moieties could be used as EWG groups. For example, such useful groups include alkyl groups having at least 1 carbon atom and at least 1 halo atom, such that most or all of the halo atoms are attached to the same carbon atom in the alkyl group. It is particularly useful that the halo atoms be attached to carbon atoms as close as possible to the O—C— carbon in the O—C(EWG)(R$_1$) group. Useful halo atoms include fluoro, chloro, and bromo, with fluoro atoms being particularly useful.

Representative EWG groups include but are not limited to, trifluoroalkyl groups (linear or branched) each having 1 to 3 carbon atoms; trichloroalkyl groups (linear or branched) each having 1 to 3 carbon atoms; cyano; nitro; carboxylic acid (carboxy); and carboxylic acid ester groups each having at least 2 carbon atoms. In many embodiments, EWG represents a trichloromethyl group or a trifluoromethyl group.

In addition, Ar in Structure (A) represents a substituted or unsubstituted arylene group such as a substituted or unsubstituted phenylene group or a substituted or unsubstituted naphthylene group. Such divalent aromatic groups can be substituted with one or more substituents that would be readily apparent to one skilled in the art that would not adversely affect the effect of the cleaving acid upon irradiation, crosslinking, metal complexation, or other properties for which the reactive polymer is designed. In many embodiments, Ar is unsubstituted phenylene.

Moreover, in Structure (A), X is NR$_2$ (secondary amino with one substituent) or O (oxy) and in most embodiments, X is oxygen. The single substituent R$_2$ can be hydrogen or a substituted or unsubstituted alkyl group having 1 to 10 carbon atoms. In many embodiments, R$_2$ is hydrogen or methyl.

In Structure (A), t-alkyl represents a substituted or unsubstituted tertiary alkyl group having 4 to 6 carbon atoms including but not limited to, a tertiary alkyl ester group having 4 carbon atoms (t-butyl), 5 carbon atoms (t-pentyl or 1,1-dimethylpropyl), or 6 carbon atoms (t-hexyl, 1,1-dimethyl-n-butyl, or 1,1-dimethyl-iso-butyl) in the alkyl moiety of the alkyl ester group. The 4 or 5 carbon atoms in the alkyl moieties are particularly useful and the t-butyl groups (substituted or unsubstituted) are most useful.

As Structure (A) represents recurring units in the reactive polymer chain, such recurring units can be present in the reactive polymer in an amount represented by "m" that is at least 1 mol % and up to and including 100 mol %, based on the total molar amount of recurring units in the reactive polymer. The amount of Structure (A) recurring units can be designed to be specific amounts depending upon the intended use of the reactive polymer. For example, in some embodiments where electroless metal plating is intended using crosslinked polymers derived from reactive polymers, m can be at least 1 mol % or at least 10 mol %, or even at least 20 mol %, and up to and including 60 mol %, or up to and including 80 mol %, or up to and including 95 mol %, or even up to and including 99 mol %, all based on the total molar amounts of recurring units in the reactive polymer. Thus, both homopolymers and copolymers comprising Structure (A) recurring units are contemplated in the practice of this invention.

The reactive polymers can comprise multiple different types of (a) recurring units that are derived from two or more different ethylenically unsaturated polymerizable monomers, or are derived by different reactions of the same or different precursor reactive polymers having reactive pendant groups.

Particularly useful reactive polymers can comprise (a) recurring units as defined by Structure (A) shown above, and (b) recurring units comprising pendant crosslinkable groups, wherein the (a) recurring units are present in an amount of at least 1 mol % and up to and including 95 mol %, and the (b) recurring units are present in an amount of at least 1 mol %, all based on the total recurring units in the reactive polymer More particular, the reactive polymers can comprise (b) recurring units in an amount of at least 1 mol % or at least 5 mol %, or even at least 10 mol %, and up to and including 40 mol % or up to and including 50 mol %, or even up to and including 70 mol %, all based on the total molar amount of recurring units in the reactive polymer, particularly where the (b) recurring units comprise pendant glycidyl groups (as described below) comprising ring-opening epoxy groups. Such amounts are represented as "n" in Structure (B) shown below.

In many embodiments of the polymers and methods of this invention, the reactive polymers are copolymers comprising at least (b) recurring units that are different from the (a) recurring units, which (b) recurring units provide crosslinking during the irradiation and subsequent heating steps described above. Useful (b) recurring units can be derived from any ethylenically unsaturated polymerizable monomers (or precursor monomers) comprising pendant groups that provide crosslinking in the presence of a cleaving acid having a pK$_a$ of 2 or less, or particularly a pK$_a$ of 0 or less, as measured in water. Compounds that provide such cleaving acids are described below.

For example, useful (b) recurring units can be represented by the following Structure (B):

wherein B' represents a pendant group providing crosslinking in the presence of the cleaving acid having a pK$_a$ of 2 or less or 0 or less, when measured in water. For example, such pendant groups can be epoxy, epithiopropyl, or aziridine groups (or combinations thereof), with the epoxy groups being particularly useful. Such crosslinkable groups can be directly attached to the polymer backbone or they can be attached through a suitable divalent linking group.

For example, some useful ethylenically unsaturated polymerizable monomers from which the (b) recurring units can be derived include but are not limited to, glycidyl acrylate, glycidyl methacrylate, and can comprise pendant groups that comprise an epoxy group (such as a glycidyl group), aziridinyl, or epithiopropyl group. Particularly useful (b) recurring units comprise pendant crosslinkable epoxy groups such as glycidyl groups and can be derived from glycidyl methacrylate or glycidyl acrylate. Other useful ethylenically unsaturated polymerizable monomers that have acid-catalyzed crosslinking groups would be readily apparent to one skilled in the art.

The reactive polymers can comprise multiple different types of (b) recurring units that are derived for example from two or more different ethylenically unsaturated polymerizable monomers.

In addition to the (a) and (b) recurring units described above, the reactive polymers can further comprise one or more additional recurring units that are different from all (a) and (b) recurring units, and herein identified as optional (c) recurring units. A skilled polymer chemist would understand how to choose such additional recurring units, and for example, they can be derived from one or more ethylenically unsaturated polymerizable monomers selected from the group consisting of alkyl acrylates (including benzyl acrylate), alkyl methacrylates (including benzyl methacrylate), (meth)acrylamides, styrene and styrene derivatives, vinyl ethers, vinyl benzoates, vinylidene halides, vinyl halides, vinyl imides, and other materials that a skilled worker in the art would understand could provide desirable properties to the reactive polymer. Such (c) recurring units can be represented as follows:

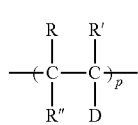

(C)

wherein the D groups in the (c) recurring units can be for example, hydrogen, substituted or unsubstituted alkyl groups (such as hydroxyalkyl groups), substituted or unsubstituted aryl groups (such as substituted or unsubstituted phenyl groups including those found in styrene monomers), alkyl ester groups, aryl ester groups, halogens, or ether groups. In many useful (c) recurring units, the D groups are alkyl carboxyl ester groups wherein the alkyl moiety has 1 to 7 carbon atoms and is linear, branched, or cyclic in form and can include benzyl ester groups.

The reactive polymers can comprise multiple different types of (c) recurring units that are derived from two or more different ethylenically unsaturated polymerizable monomers.

In Structure (C), p represents the mol % of such (c) recurring units and when such recurring units are present, p is at least 1 mol % or at least 5 mol % or even at least 10 mol %, and up to and including 25 mol %, or even up to and including 50 mol %, all based on the total molar amount of recurring units in the reactive polymer.

In the (a), (b), and (c) recurring units, R, R', R" can be the same or different hydrogen, methyl, ethyl, or chloro groups and each type of recurring unit can have the same or different R, R', and R" groups along the reactive polymer backbone. In most embodiments, R, R', and R" are hydrogen or methyl for all recurring units along the reactive polymer backbone, and R, R', and R" can be the same or different for the each type of (a), (b), and (c) recurring units in a given reactive polymer.

In some particularly useful methods described therein, R, R', and R" are independently hydrogen or methyl, $R_1$ is hydrogen or methyl, L is a carbonyloxyalkylene group having 1 to 10 carbon atoms or a substituted or unsubstituted arylene group, EWG represents a trichloromethyl or trifluoromethyl group, X is oxygen, Ar is a substituted or unsaturated phenylene group, and t-alkyl represents a tertiary alkyl group having 4 or 5 carbon atoms. Moreover, EWG can represent trifluoromethyl, Ar is an unsubstituted phenylene group, and t-alkyl represents a tertiary butyl group.

In Structures (A), (B), and (C), "m", "n", and "p" are used to represent the respective molar amounts of the defined types of recurring units, based on total recurring units, in a given reactive polymer, so that the sum of m, n, and p equal 100 mol % in a given reactive polymer. The amounts of m, n, and p are defined above for each type of recurring unit.

The mol % amounts of the various recurring units defined herein for the reactive polymers defined herein are meant to refer to the actual molar amounts present in the reactive polymers. It is understood by one skilled in the art that the actual mol % values may differ from those theoretically possible from the amount of ethylenically unsaturated polymerizable monomers that are used in the polymerization procedure to synthesize the reactive polymers (or reactive polymer precursors). However, under most polymerization conditions that allow high polymer yield and optimal reaction of all monomers, the actual mol % of each monomer is generally within ±15 mol % of the theoretical amounts.

Some representative reactive polymer embodiments include but are not limited to, the following copolymers and terpolymers wherein the molar ratios are theoretical (nominal) amounts based on the molar ratio of ethylenically unsaturated polymerizable monomers used in the polymerization process. As noted, the actual molar amounts of recurring units can differ from the theoretical (nominal) amounts of monomers if the polymerization reactions are not carried out to completion.

Poly(3-[(4-t-butoxycarbonyloxy)-α-trifluoromethylbenzylsulfo]propyl methacrylate-co-glycidyl methacrylate) (85:15 mol %);

Poly(3-[(4-t-butoxycarbonyloxy)-α-trifluoromethylbenzylsulfo]propyl methacrylate-co-glycidyl methacrylate) (95:5 mol %);

Poly(3-[(4-t-butoxycarbonyloxy)-α-trifluoromethylbenzylsulfo]propyl methacrylate-co-glycidyl methacrylate) (70:30 mol %);

Poly(3-[(4-t-butoxycarbonyloxy)-α-trifluoromethylbenzylsulfo]propyl methacrylate-co-glycidyl methacrylate-co-t-butyl methacrylate) (65:15:20 mol %);

Poly(3-[(4-t-butoxycarbonyloxy)-α-trifluoromethylbenzylsulfo]propyl methacrylate-co-glycidyl methacrylate-co-butyl methacrylate) (55:15:30 mol %);

Poly(3-[(4-t-butoxycarbonyloxy)-α-trifluoromethylbenzylsulfo]propyl methacrylate-co-glycidyl methacrylate-co-benzyl methacrylate) (75:15:10 mol %);

Poly(2-[(4-t-butoxycarbonyloxy)-α-trifluoromethylbenzylsulfo]ethyl acrylate-co-glycidyl methacrylate) (85:15 mol %); and Poly(4-[(4-t-butoxycarbonyloxy)-α-trifluoromethylbenzylsulfo]styrene-co-glycidyl methacrylate) (85:15 mol %).

The reactive polymers useful in the invention generally have a molecular weight ($M_w$) of at least 30,000 and up to and including 1,000,000 as measured by gel permeation chromatography (GPC) or by size exclusion chromatography (SEC).

Examples of reactive polymers can be prepared using known free radical solution polymerization techniques using known starting materials, free radical initiators, and reaction conditions in suitable organic solvents such as dimethyl formamide, N,N-dimethylacetamide, tetrahydrofuran, methyl ethyl ketone, isopropyl alcohol, and various Dowanol® solvents that can be adapted from known polymer chemistry. Where starting materials (such as ethylenically unsaturated polymerizable monomers) are not available commercially, such starting materials can be synthesized using known chemical starting materials and procedures. It may also be desirable to prepare reactive polymer precursors that would have pendant groups that can be modified using one or more reactions to provide the desired pendant groups for either or both (a) or (b) recurring units defined above. Such reactive polymer precursors can be prepared using known starting materials, polymerization conditions, and post-polymerization reaction conditions and materials that would be readily apparent to one skilled in polymer chemistry using the teaching provided herein.

Representative preparations of particularly useful reactive polymers are provided below for the Invention Examples. Additional details of polymerization procedures and starting materials can be found in Malcolm P. Stevens, *Polymer Chemistry: An Introduction,* 3$^{rd}$ Edition, Oxford University Press, 1999.

In general, the reactive polymers can be stored in solution in suitable organic solutions or dispersions. Depending upon the sensitivity of the reactive polymer to light (such as room light), during and after preparation, the reactive polymers can be kept in the dark or away from light exposure until they are formulated into reactive compositions and used for various purposes.

Reactive Compositions

The reactive polymers described herein can be used in reactive compositions incorporated into polymeric layers in various methods for forming conductive patterns, for example using electroless plating after metal seed catalysts are formed in a patternwise fashion.

Each reactive composition has only three essential components: (1) one or more reactive polymers as described above that can be de-blocked and crosslinked upon exposure to radiation having $\lambda_{max}$ of at least 150 nm and up to and including 450 nm; (2) one or more compounds that provide a cleaving acid upon exposure to the radiation described above, that can provide a cleaving acid having a pK$_a$ of 2 or less, or even 0 or less, as measured in water; and (3) one or more crosslinking agents, each of which is capable of reacting in the presence of the cleaving acid by (2), to provide crosslinking in the reactive polymer. While various other optional components can be included as described below (such as a photosensitizer), only components (1), (2), and (3) are essential for providing the desired precursor article, intermediate articles, product articles, and conductive electroless metal plated pattern in the reactive composition forming the polymeric layer as described herein.

One or more reactive polymers as described above are generally present in the reactive composition (and in the resulting dry polymeric layer) in an amount of at least 50 weight % and up to and including 99.5 weight %, or typically at least 80 weight % and up to and including 95 weight %, based on the total solids in the reactive composition (or total dry weight of the polymeric layer).

The compounds used in the present invention to provide a cleaving acid having a pKa of less than 2 or typically a pKa less than 0, as measured in water, generally absorb radiation having a $\lambda_{max}$ of at least 150 nm and up to and including 450 nm, or typically radiation having a $\lambda_{max}$ of at least 150 nm and up to and including 330 nm. Upon such exposure, these compounds cleave the tertiary alkyl ester groups in the pendant groups of the (a) recurring units in the reactive polymer and begin a chain of reactions that will leave pendant sulfonic acid groups (as well as any sulfonate groups) as metal complexation sites.

Particularly useful compounds to provide cleaving acids are onium salts that decompose upon the noted irradiation. An onium salt (also known as an onium compound) is a compound that is formed by the attachment of a proton to a mononuclear parent hydride of a Group 15 element (for example nitrogen and phosphorus), a chalcogen of Group 16 (for example sulfur and selenium), or a halogen (such as fluorine, bromine, chlorine, and iodine). Particularly useful (b) compounds include but are not limited to, onium salts such as sulfonium salts, phosphonium salts, iodonium salts, aryldiazonium salts, and other acid-generating compounds such as nitrobenzyl esters as described for example in U.S. Pat. No. 5,200,544 (Houlihan et al.) and oximes of sulfonates as described in U.S. Pat. No. 7,749,677 (Ando). The sulfonium salts, phosphonium salts, and iodonium salts are particularly useful, including but not limited to the arylsulfonium salts and aryliodonium salts that can provide an acid having a pKa less than 2, or even less than 0, as measured in water.

Useful onium salts have substituted aryl groups and strong acid anions such as hexafluorophosphate, tetrafluoroborate, hexofluoroarsenate, hexafluoroantimonate, and trifluoromethylsulfonate (triflate). Representative examples of useful onium salts include triarylsulfonium and biaryl iodonium salts such as triphenylsulfonium triflate, (4-methylphenyl) diphenylsulfonium triflate, (4-t-butylphenyl)diphenylsulfonium triflate, 4-methoxyphenyl)diphenylsulfonium triflate, and bis(4-t-butylphenyl)iodonium triflate.

One or more compounds to provide the cleaving acids described herein are generally present in the reactive composition (and dry polymeric layer) in an amount of at least 0.5 weight % and up to and including 40 weight %, or more likely at least 2 weight % and up to and including 20 weight %, based on the total solids in the reactive composition (or dry polymeric layer weight).

The reactive composition also includes one or more (3) crosslinking agents. In many embodiments, such crosslinking agents can be part of the (a) reactive polymer, for example as part of the (b) recurring units as described above and in the described molar amounts. In other embodiments, the (3) crosslinking agent is a compound (or group of compounds) distinct from the (a) reactive polymers. In other words, these crosslinking agents are not attached to or complexed with the (a) reactive polymer. Such crosslinking agents are capable of reacting with the pendant sulfonic acid groups generated from the deblocking in the (a) reactive polymer in the presence of the cleaving acid provided by the (2) compound described above, or other reactive groups that are associated with the (b) or (c) recurring units that can be in the reactive polymer.

Some useful (3) crosslinking agents that are not part of the (a) reactive polymer include but are not limited to, melamine formaldehyde resins, glycoluril formaldehyde resins, polycarboxylic acids and anhydrides, polyamines, epihalohydrins, diepoxides, dialdehydes, diols, carboxylic acid halides, ketenes, aziridines, carbodiimides, isocyanates, and mixtures thereof. Such (3) crosslinking agents can be present in the reactive composition in an amount of at least 1 weight % and up to and including 30 weight %, or more typically at least 2 weight % and up to and including 15 weight %, based on the total solids in the reactive composition. The particular useful amount can be determined in view of the particular (3) crosslinking agent and specific (a) reactive polymer that is used.

While not essential, it is sometimes desirable to enhance the sensitivity of some reactive compositions to longer wavelengths (for example, at least 300 nm and up to and including 450 nm) by including one or more (4) photosensitizers in the reactive composition used in this invention. A variety of photosensitizers are known in the art such as aromatic tertiary amines, aromatic tertiary diamines and certain aromatic polycyclic compounds such as substituted or unsubstituted anthracene compounds, as described for example in U.S. Pat. No. 4,069,054 (Smith) and U.S. Pat. No. 7,537,452 (Dede et al.). Particularly useful photosensitizers include unsubstituted anthracene and substituted anthracenes such as 9,10-diethoxyanthracene and 2-t-butyl-9,10-diethoxyanthracene.

One or more photosensitizers can be present in the reactive composition (and resulting dry polymeric layer) in an amount of at least 0.1 weight % and up to and including 30 weight %, or more likely at least 0.5 weight % and up to and including 15 weight %, based on the total solids in the reactive composition (or total dry weight of the polymeric layer).

The reactive compositions can optionally include one or more addenda such as film-forming compounds, surfactants, plasticizers, filter dyes, viscosity modifiers, high boiling solvents that are compatible with the reactive polymer (such as phthalated esters including dibutyl phthalate and dioctyl phthalate), and any other optional components that would be readily apparent to one skilled in the art, and such addenda can be present in amounts that would also be readily apparent to one skilled in the art.

The essential (1) through (3) compounds and any optional compounds described above are generally dissolved or dispersed in organic solvent (or mixture of organic solvents) to form a reactive composition that can be applied to a suitable substrate (described below). Useful organic solvents include but are not limited to, ketones such as 2-butanone, cyclopentanone and cyclohexanone, substituted benzenes such as chlorobenzene and anisole, ethyl lactate, propylene glycol methyl ether acetate, or γ-butyrolactone. Various mixtures of these organic solvents can be used if desired especially to dilute more toxic organic solvents with less toxic organic solvents such as blends of cyclopentanone with any of ethyl lactate, propylene glycol methyl ether acetate, or γ-butyrolactone. Some water can also be present if it is miscible with the organic solvents that predominant the reaction medium.

Articles

The reactive composition described above can be applied to a suitable substrate using any suitable method including but not limited to, spin coating, bead coating, blade coating, curtain coating, or spray coating, from a suitable reservoir to form a polymeric layer. Useful substrates can be chosen for particular use or method as long as the substrate material will not be degraded by the reactive composition or any treatments to which the resulting precursor articles are subjected during the method of this invention. The reactive composition can be applied multiple times if desired to obtain a thicker coating (reactive polymer layer) of the reactive composition, and dried between each coating or dried only after the last application. Solvent(s) can be removed from the reactive composition using any suitable drying technique.

In general, the final dry coating of reactive composition (polymeric layer) can have an average dry thickness of at least 10 nm and up to and including 1 mm, with a dry thickness of at least 0.1 µm and up to and including 100 µm being more useful. The average dry thickness can be determined by measuring the dry layer thickness in at least 2 different places within a 10 cm by 10 cm square of the dry reactive layer using an electron microscope or other suitable analytical device.

Thus, useful substrates can be composed of glass, quartz, and ceramics as well as a wide variety of flexible materials such as cellulosic papers and polyesters including poly(ethylene terephthalate) and poly(ethylene naphthalate), polycarbonates, polyamides, poly(meth)acrylates, and polyolefins. Useful polymeric substrates can be formed by casting or extrusion methods. Laminates of various substrate materials can also be put together to form a composite substrate. Any of the substrates can be treated to improve adhesion using for example corona discharge, oxygen plasma, ozone or chemical treatments using silane compounds such as aminopropyltriethoxysilane. The substrates can be of any suitable dry thickness including but not limited to at least 10 µm and up to and including 10 mm, depending upon the intended use of the resulting articles.

Particularly useful substrates are composed of poly(ethylene terephthalate) such as biaxially oriented poly(ethylene terephthalate) (PET) films that have broad uses in the electronics market. These PET films, ranging in dry thickness of at least 50 µm and up to and including 200 µm, can also comprise, on at least one side, a polymeric primer layer (also known as a subbing layer, adhesive layer, or binder layer) that can be added prior to or after film stretching. Such polymeric primer layers can comprise poly(acrylonitrile-co-vinylidene chloride-co-acrylic acid), poly(methyl acrylate-co-vinylidene chloride-co-itaconic acid), poly(glycidyl methacrylate-co-butyl acrylate), or various water-dispersible polyesters, water-dispersible polyurethanes, or water-dispersible polyacrylics, as well as sub-micrometer silica particles. The dry thickness of the primer layer can be at least 0.1 µm and up to and including 1 µm.

Thus, with the application of the described reactive composition to a suitable substrate, with or without appropriate drying, the present invention provides a precursor article comprising a substrate and having disposed thereon a polymeric layer comprising: (1) the reactive polymer described above; (2) the compound that provides a cleaving acid having a $pK_a$ or 2 or less as measured in water, upon suitable exposure as described above; (3) a crosslinking agent that is capable of reacting in the presence of the cleaving acid, to provide crosslinking in the reactive polymer; and (4) optionally, a photosensitizer.

Uses of Reactive Compositions

The reactive compositions described herein can be used to form reactive polymer patterns (or patterns of the reactive compositions) that can be used as described below to form surface conductive patterns for various purposes as described above. The following discussion provides some details about representative electroless plating methods in which the reactive compositions described herein can be used.

In these electroless plating methods, each aqueous-based "processing" solution, dispersion, or bath (for example, solutions containing electroless seed metal ions, reducing agent solutions, and solutions for electroless plating, as well as rinsing solutions) used at various points can be specifically designed with essential components as well as optional addenda that would be readily apparent to one skilled in the art. For example, one or more of those aqueous-based processing solutions can include such addenda as surfactants, anti-coagulants, anti-corrosion agents, anti-foamants, buffers, pH modifiers, biocides, fungicides, and preservatives. The aqueous-based reducing solutions can also include suitable antioxidants.

Electroless Plating Method 1:

The method of this invention for forming a pattern in a polymeric layer comprises providing a polymeric layer (as in forming the described precursor article), the polymeric layer comprising the reactive composition described above. This polymeric layer can be formed on a suitable substrate, if desired, as described above by suitable application of the reactive composition, after which the reactive composition is typically dried before the resulting precursor article is used in the method of this invention.

This polymeric layer in the precursor article, usually in dry form, can be then patternwise exposed to radiation having a $\lambda_{max}$ of at least 150 nm and up to and including 450 nm (or at least 150 nm and up to and including 400 nm), to provide a polymeric layer comprising non-exposed regions and exposed regions comprising an at least partially crosslinked polymer having pendant sulfonic acid groups. This exposure can be provided with any suitable exposing source or device that provides the desired radiation including but not limited to, various arc lamps and LED sources. The particular exposing source can be chosen depending upon the absorption characteristics of the reactive composition used. The exposing radiation can be projected through lenses and mirrors or through a lens or mask element that can be in physical contact or in proximity with the outer surface of the polymeric layer. Exposure time can range from a fraction (0.1) of a second and up to and including 10 minutes depending upon the intensity of the radiation source and the reactive composition. Suitable masks can be obtained by known methods including but not limited to photolithographic methods, flexographic methods, or vacuum deposition of a chrome mask onto a suitable substrate such as quartz or high quality optical glass followed by photolithographic patterning.

It is optional but desirable to heat or bake the polymeric layer in the precursor article simultaneously with or after the patternwise exposure at a temperature sufficient to further generate sulfonic acid groups in the exposed regions of the polymeric layer. In most embodiments, this heating is carried out at least after the patternwise exposure of the polymeric layer, but it can be carried out both during and after the patternwise exposure of the polymeric layer. Such heating can be accomplished on a hot plate with vacuum suction to hold the precursor article in close contact with the heating surface. Alternatively, the heating device can be a convection oven. The duration of the heating procedure is generally less than 10 minutes with heating for least 10 seconds and up to and including 5 minutes being most likely. The optimal heating time and temperature can be readily determined with routine experimentation depending upon the particular reactive composition, for example at a temperature of at least 50° C. and up to and including 180° C. for a time of up to 10 minutes.

The polymeric layer is generally hydrophilic in the exposed regions while still being hydrophobic in the non-exposed regions such that immersion in aqueous-based solutions (described below) will allow the aqueous molecules, ions, or reagent molecules to rapidly diffuse into the exposed regions.

At any time after the patternwise exposing or optional heating procedures, the reactive composition remaining in the non-exposed regions of the polymeric layer can be removed using an organic solvent in which the polymeric layer comprising the reactive composition is soluble or dispersible. In such procedures at least 50 weight % and typically at least 80 weight % or even at least 90 weight % of the reactive composition in the polymeric layer is removed from the non-exposed regions, based on the total amount of reactive composition originally present in those non-exposed regions. Upon this removal of reactive composition from the non-exposed regions of the polymeric layer, the various articles described herein will contain de-blocked and crosslinked polymer in the exposed regions of the polymeric layer, along with reducing agent molecules, electroless seed metal ions, electroless seed metal particles, or electroless plated metal, depending upon the stage at which the non-exposed reactive composition has been removed.

The removal procedure can be carried out in any suitable manner, including immersion of the intermediate or product article into a suitable organic solvent or mixture of organic solvents or by spraying the organic solvent or mixture of organic solvents onto the intermediate article surface. Contact with the organic solvent (or mixture thereof) can be carried out for a suitable time and temperature so that reactive composition is desirably removed in the non-exposed regions but little removal (less than 10 weight % of the total material) occurs in the exposed regions containing the de-blocked and crosslinked polymer derived from the reactive polymer. For example, the contact time can be at least 10 seconds and up to and including 10 minutes, and the contact temperature can be at room temperature (about 20° C.) and up to and including 50° C.

Organic solvents that can used for this purpose include but are not limited to, ketones such as 2-butanone, cyclopentanone and cyclohexanone, substituted benzenes such as chlorobenzene and anisole, ethyl lactate, propylene glycol methyl ether acetate, or γ-butyrolactone. Various mixtures of these organic solvents can be used if desired especially to dilute more toxic organic solvents with less toxic organic solvents such as blends of cyclopentanone with any of ethyl lactate, propylene glycol methyl ether acetate, or γ-butyrolactone.

In many embodiments, removing the reactive composition in the non-exposed regions of the polymeric layer is carried out immediately after the patternwise exposure and any optional heating procedure.

This results in an intermediate article of this invention comprising a substrate and having disposed thereon a polymeric layer comprising exposed regions and non-exposed regions, the exposed regions comprising a pattern of polymer comprising reactive sulfonic acid groups, which polymer has been derived from the reactive polymer described above in the reactive composition as described above, and the non-exposed regions comprising a reactive composition as described above, unless the reactive composition has been removed as noted above.

The polymeric layer is generally hydrophilic in the crosslinked and exposed regions such that immersion in aqueous-based solutions (described below) will allow the aqueous molecules, ions, or reagent molecules to rapidly diffuse into the exposed regions.

Once patternwise exposure and optional heating have been carried out, the exposed regions of the polymeric layer can be contacted with an aqueous-based solution or dispersion of electroless seed metal ions to form a pattern of electroless seed metal ions in the exposed regions of the polymeric layer. There are various ways that this contacting can be carried out. Typically, the entire intermediate article is immersed within a dilute aqueous-based solution, bath, or dispersion of the electroless seed metal ions for a sufficient time to coordinate the optimum number of electroless seed metal ions within the crosslinked polymer that has been derived from the reactive polymer described above. For example, this contact with the electroless seed metal ions can be carried out for at least 1 second and up to and including 30 minutes, at room temperature (about 20° C.) or at a higher temperature of up to and including 95° C. The time and temperature for this contact can be optimized for a given reactive composition and electroless seed metal ions that are to be used.

Representative electroless seed metal ions that can be used in these procedures are selected from the group consisting of silver ions, platinum ions, palladium ions, gold ions, tin ions, rhodium ions, iridium ions, nickel ions, and copper ions. Most noble metal ions can serve as electroless seed metal ions in the present invention. These electroless seed metal ions can be provided in the form of a suitable metal salt or metal-ligand complex (that can have an overall positive, negative, or neutral charge). Useful materials of this type include but are not limited to, metal salts and metal-ligand complexes of nitrates, halides, acetates, cyanides, thiocyanates, amines, nitriles, and sulfates. Thus, the electroless seed metal ions can be provided from simple salts or in the form of metal-ligand complexes. The amount of metal salts or metal-ligand complexes present in the aqueous-based solution would be readily apparent to one skilled in the art and can be optimized for a particular reactive composition and exposure procedure. For example, the metal salts or metal-ligand complexes can be present in the aqueous-based solution in an amount sufficient to provide at least 0.00001 molar and up to and including 2 molar of the desired electroless metal ions. In one embodiment, a 0.4 molar silver nitrate solution can be used at room temperature to provide electroless seed silver ions. In another embodiment, a 0.001 molar palladium chloride solution is used to provide electroless metal palladium ions.

The contact with the electroless seed metal ions produces an intermediate article comprising a substrate and having disposed thereon a polymeric layer comprising exposed regions and non-exposed regions, the exposed regions comprising a pattern of electroless seed metal ions complexed within the at least partially crosslinked polymer derived from a reactive polymer in a reactive composition as described above, and the non-exposed regions comprising a reactive composition as described above, unless it has been removed as described above.

Optionally at this point, the reactive composition can be removed from the non-exposed regions of the polymeric layer as described above, leaving the pattern of electroless seed metal ions within the de-blocked and crosslinked polymer in the exposed regions of the polymeric layer.

If this removal procedure is carried out, an intermediate article is created, which intermediate article comprises a substrate and having disposed thereon exposed regions of the polymeric layer containing at least partially crosslinked polymer derived from a reactive polymer as described above, and non-exposed regions of the polymeric layer comprising little or no reactive composition, wherein the exposed regions further comprise a pattern of electroless seed metal ions coordinated within the at least partially crosslinked polymer.

After forming the pattern of electroless seed metal ions, the electroless seed metal ions are then reduced to provide a pattern of the corresponding electroless seed metal particles in the exposed regions of the polymeric layer. This can be done by contacting the polymeric layer (or at least the exposed regions) with a suitable reducing agent for the electroless seed metal ions. For example, the intermediate article comprising the polymeric layer can be immersed within an aqueous-based reducing solution containing one or more reducing agents for a suitable time to cause sufficient metal ion reduction. Alternatively, an aqueous-based reducing solution comprising the reducing agent can be sprayed or rolled uniformly onto the polymeric layer.

Useful reducing agents include but are not limited to, an organic borane, an aldehyde such as formaldehyde, aldehyde sugar, hydroquinone, or sugar (or polysaccharide) such as ascorbic acid, and metal ions such as tin(II). These reducing agents can be used individually or in combination, and the total amount in the aqueous-based reducing solution used for the reducing procedure can be at least 0.01 weight % and up to and including 20 weight % based on the total reducing solution weight. The amount of reducing agent to be used will depend upon the particular electroless seed metal ions and reducing agent to be used, and this can be readily optimized using routine experimentation. The time and temperature for the reduction can also be readily optimized in the same manner. Generally, the reducing temperature is at least room temperature (about 20° C.) and up to and including 95° C. and the reducing time can be for at least 1 second and up to and including 30 minutes.

For example, some embodiments of the present invention can be carried out using an immersion bath comprising 1 reducing solution weight % of an organic borane such as dimethylamine borane (DMAB) at room temperature for up to 3 minutes. Longer or shorter times at higher temperatures are possible if needed.

After this reducing procedure, the polymeric layer, especially the exposed regions, can be again washed using distilled water or deionized water or another aqueous-based solution at a suitable temperature for a suitable time.

At this point, the method of this invention has provided yet another intermediate article, comprising a substrate and having disposed thereon a polymeric layer comprising exposed regions and non-exposed regions, the exposed regions comprising a pattern of corresponding electroless seed metal particles within the at least partially crosslinked polymer that has been derived from the reactive polymer in the reactive composition described above, and the non-exposed regions comprising a reactive composition as described above.

Optionally, the reactive composition in the non-exposed regions of the polymeric layer can be removed (as described above) after this reducing procedure. This would produce yet another intermediate article that would comprise exposed regions in the polymeric layer comprising a pattern of corresponding electroless seed metal particles within the exposed regions, but comprise little or no reactive composition in the non-exposed regions of the polymeric layer.

This intermediate article can be immediately immersed in an aqueous-based electroless metal plating bath or solution, or the intermediate article can be stored with just the catalytic pattern comprising corresponding electroless seed metal particles for use at a later time.

The intermediate article can be contacted with an electroless plating metal that is the same as or different from the corresponding electroless seed metal particles. In most embodiments, the electroless plating metal is a different metal from the corresponding electroless seed metal particles.

Any metal that will likely electrolessly "plate" on the corresponding electroless seed metal particles can be used at this point, but in most embodiments, the electroless plating metal can be for example copper(II), silver(I), gold(IV), palladium (II), platinum(II), nickel(II), chromium(II), and combinations thereof. Copper(II), silver(I), and nickel(II) are particularly useful electroless plating metals.

The one or more electroless plating metals can be present in the aqueous-based electroless plating bath or solution in an amount of at least 0.01 weight % and up to and including 20 weight % based on total solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that contains formaldehyde as a reducing agent. Ethylenediaminetetraacetic acid (EDTA) or salts thereof can be present as a copper complexing agent. For example, copper electroless plating can be carried out at room temperature for several seconds and up to several hours depending upon the desired deposition rate and plating rate and plating metal thickness.

Other useful aqueous-based electroless plating solutions or baths comprise silver(I) with EDTA and sodium tartrate, silver(I) with ammonia and glucose, copper(II) with EDTA and dimethylamineborane, copper(II) with citrate and hypophosphite, nickel(II) with lactic acid, acetic acid, and a hypophosphite, and other industry standard aqueous-based electroless baths or solutions such as those described by Mallory et al. in *Electroless Plating: Fundamentals and Applications* 1990.

After the electroless plating procedure, the resulting product article is removed from the aqueous-based electroless plating bath or solution and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising a pattern of electrolessly plated (for example in a pattern) metal complexed within or deposited on the surface of the at least partially crosslinked polymer comprising sulfonic acid groups and derived from the reactive polymer in a reactive composition as described above, and the non-exposed regions comprising reactive composition as described above.

Optionally at this point, the reactive composition can be removed from the non-exposed regions of the polymeric layer after electrolessly plating the corresponding electroless seed metal particles so that the resulting product article comprises a pattern of electrolessly plated metal in the exposed regions of the polymeric layer comprising the de-blocked and crosslinked polymer, but the product article comprises little or no reactive composition in the non-exposed regions of the polymeric layer.

To change the surface of the electroless plated metal for visual or durability reasons, it is possible that a variety of post-treatments can be employed including surface plating of still at least another (third or more) metal such as nickel or silver on the electrolessly plated metal (this procedure is sometimes known as "capping"), or the creation of a metal oxide, metal sulfide, or a metal selenide layer that is adequate to change the surface color and scattering properties without reducing the conductivity of the electrolessly plated (second) metal. Depending upon the metals used in the various capping procedures of the method, it may be desirable to treat the electrolessly plated metal with a seed metal catalyst in an aqueous-based seed metal catalyst solution to facilitate deposition of additional metals.

After the electroplating procedure described above, the product article is removed from the electroless plating bath and can be further treated to decompose any residual onium salt on the polymeric layer or to change the visual characteristics and or durability of the electrolessly plated metal. For example, to decompose any remaining onium salt or other compound that provides a cleaving acid, the polymeric film can be uniformly exposed or blanket flashed with ultraviolet radiation and baked (or heated) similarly as described above after the initial exposure.

As one skilled in the art should appreciate, the individual treatment features or steps described above for this method can be carried out two or more times before proceeding to the next procedure or step. For example, the treatment with the aqueous-based solution containing electroless seed metal ions can be carried out two or more times in sequence, for example, with a rinsing step between sequential treatments. The electroless seed metal ions can be the same or different for the sequential treatments and the treatment conditions can be the same or different.

In addition, multiple treatments with an aqueous-based reducing solution or aqueous-based electroless metal plating solution can be carried out in sequence, using the same or different conditions. Sequential washing or rinsing steps can also be carried out where appropriate.

Further, the electroless plating procedures can be carried out multiple times, in sequence, using the same or different electroless plating metal and the same or different electroless plating conditions.

It is also possible to use the article provided by this method that comprises the noted pattern of an electrolessly plated metal, to incorporate a second or more patterns in the non-exposed regions. This can be accomplished by subjecting this product article to the same sequence of procedures or steps using the same or different reagents and aqueous-based solutions to provide at least a second pattern in what would be considered second exposed regions since the electrolessly plated metal would be in what is considered the first exposed regions. The second exposed regions can comprise all of the original non-exposed regions, or they can comprise only some of the non-exposed regions. For example, to create a second pattern in the product article having the electrolessly plated metal, the article can be treated or processed as follows, using conditions and aqueous-based solutions similar to or the same as those described above:

a) patternwise exposing the previously non-exposed regions comprising reactive composition to form second exposed regions in the polymeric layer, b) optionally heating the polymeric layer, c) contacting at least the second exposed regions with an aqueous-based solution containing electroless seed metal ions, and optionally rinsing, d) reducing the coordinated electroless seed metal ions with an aqueous-based reducing solution, and optionally rinsing, and e) electrolessly plating the same or different metal in the second exposed regions.

The reactive polymers and reactive compositions described above can also be used in additional patterning methods described as follows:

Electroless Plating Method 2:

This method can be used to form a pattern in a polymeric layer, the method comprising:

providing a polymeric layer comprising a reactive composition that comprises: (1) a reactive polymer according to the present invention; (2) a compound that provides a cleaving acid as described above; (3) a crosslinking agent that is capable of reacting in the presence of the cleaving acid, to provide crosslinking in the reactive polymer; and (4) optionally, a photosensitizer, all as described above, patternwise exposing the polymeric layer to radiation having a $\lambda_{max}$ of at least 150 nm and up to and including 450 nm that is sufficient to induce generate pendant sulfonic acids within the reactive polymer, to provide a polymeric layer comprising non-exposed regions and exposed regions comprising an at least partially crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further generate sulfonic acid groups in the at least partially crosslinked polymer in the exposed regions of the polymeric layer, incorporating a reducing agent into the exposed regions of the polymeric layer, contacting the exposed regions of the polymeric layer with electroless seed metal ions to oxidize the reducing agent in the exposed regions of the polymeric layer and to form a pattern of electroless seed metal particles in the exposed regions of the polymeric layer, and electrolessly plating the corresponding electroless seed metal particles in the exposed regions of the polymeric layer with a metal that is the same as or different from the corresponding electroless seed metal particles.

The polymeric layer in a precursor article, usually in dry form, can be then patternwise exposed to radiation having a $\lambda_{max}$ of at least 150 nm and up to and including 450 nm or to radiation having a $\lambda_{max}$ of at least 150 nm and up to and including 400 nm, as described above.

It is optional but desirable to heat or bake the reactive composition in the precursor article simultaneously with or after the patternwise exposure but generally before contacting the exposed polymeric layer with the aqueous-based reducing solution (described below) and conditions as described above for the Electroless Plating Method 1.

The polymeric layer is generally hydrophilic in the exposed regions while still being hydrophobic in the non-exposed regions such that immersion in aqueous-based solutions (described below) will allow the aqueous molecules, ions, or reagents to rapidly diffuse into the exposed regions.

At any time after the patternwise exposing or optional heating procedures, the reactive composition in the non-exposed regions of the polymeric layer can be removed using an organic solvent in which the polymeric layer comprising the reactive composition is soluble or dispersible as described for the Electroless Plating Method 1.

In many embodiments, removing the reactive composition in the non-exposed regions of the polymeric layer is carried out immediately after the patternwise exposure and any optional heating procedure.

At this point, an intermediate article has been created in which the exposed regions of the polymeric layer on the substrate comprise de-blocked and crosslinked polymer derived from the reactive polymer in the reactive composition as described herein, and the non-exposed regions of the polymeric layer comprise little or no reactive composition.

After the exposure and optional heating, the exposed regions of the polymeric layer are contacted with an aqueous-based reducing solution containing one or more reducing agents and conditions, as described above for the Electroless Plating Method 1. In the exposed regions, the reducing agent can diffuse into the crosslinked polymer provided during irradiation or the reactive composition described herein. In the non-exposed regions, the reducing agent does not readily diffuse into or attach to the substrate where the non-crosslinked reactive polymer had been removed, or to the reactive composition (if present).

After this reducing procedure, the polymeric layer, especially the exposed regions, can be again washed using distilled water or deionized water or another aqueous-based solution at a suitable temperature for a suitable time.

At this point, an intermediate article is provided, which intermediate article comprises a substrate and having disposed thereon a polymeric layer comprising exposed regions and non-exposed regions, the exposed regions comprising a pattern of a crosslinked polymer derived from the reactive polymer in the reactive composition described herein, and comprising reducing agent dispersed within the crosslinked polymer, and the non-exposed regions comprising a reactive composition as described above.

Optionally at this point, the reactive composition in the non-exposed regions of the polymeric layer can be removed from the substrate as described above, leaving the reducing agent diffused into the de-blocked and crosslinked polymer in the exposed regions of the polymeric layer.

If this procedure is carried out, an intermediate article is created, which intermediate article comprises a substrate and having disposed thereon exposed regions of the polymeric layer containing crosslinked polymer, and non-exposed regions of the polymeric layer comprising little or no reactive composition, wherein the exposed regions further comprise a reducing agent diffused within the de-blocked and crosslinked polymer.

Once the patternwise exposure, optional heating, and contacting with the reducing agent have been carried out, the exposed regions of the polymeric layer can be contacted with an aqueous-based solution or dispersion of electroless seed metal ions to form electroless seed metal particles in the exposed regions of the polymeric layer using aqueous-based solutions and conditions as described above. These electroless seed metal particles form catalytic sites for electroless metal plating (deposition of metal) described below.

The contact with the electroless seed metal ions produces an intermediate article comprising a substrate and having disposed thereon a polymeric layer comprising exposed regions and non-exposed regions, the exposed regions comprising a pattern of electroless seed metal particles within the crosslinked polymer resulting from the irradiation of the reactive polymer in the reactive composition described herein, and the non-exposed regions comprising reactive composition (if not removed).

After the requisite time to react within the resulting crosslinked polymer in the exposed regions, the polymeric layer can be rinsed with distilled or deionized water or other aqueous-based solution for a suitable time and at a suitable temperature, usually room temperature or slightly higher.

Optionally at this point, the reactive composition can be removed from the substrate in the non-exposed regions of the polymeric layer as described above for Electroless Plating Method 1, leaving the pattern of electroless seed metal particles in the exposed regions of the polymeric layer.

If this procedure is carried out, an intermediate article is created, which intermediate article comprises a substrate and having disposed thereon exposed regions of the polymeric layer containing de-blocked and crosslinked polymer, non-exposed regions of the polymeric layer comprising little or no reactive composition, wherein the exposed regions further comprise a pattern of electroless seed metal particles.

The resulting intermediate article can be immediately immersed in an aqueous-based electroless plating bath or solution or the immediate article can be stored with the catalytic pattern comprising corresponding electroless seed metal particles for use at a later time. The intermediate article can be contacted with an electroless plating metal that is the same as or different from the corresponding electroless seed metal particles, using aqueous-based solutions and conditions as described above.

After the electroless plating procedure, a product article is removed from the aqueous-based electroless plating bath and can again be washed using distilled water or deionized water or another aqueous-based solution to remove any residual electroless plating chemistry. At this point, the polymeric layer and electrolessly plated metal are generally stable and can be used for their intended purpose.

Optionally at this point, the reactive composition can be removed from the non-exposed regions of the polymeric layer after electrolessly plating the corresponding electroless seed metal particles so that the resulting product article comprises a pattern of electrolessly plated metal in the exposed regions of the polymeric layer containing the de-blocked and crosslinked polymer, but the resulting product article comprises little or no reactive composition in the non-exposed regions of the polymeric layer.

Thus, this method provides a product article comprising a substrate and having disposed thereon a polymeric layer comprising exposed regions and non-exposed regions, the exposed regions comprising a pattern of an electroless seed metal particles (for example, in a pattern) that have been electrolessly plated with the same or different metal, and crosslinked polymer resulting from irradiation of the reactive polymer in the reactive composition described above, and the non-exposed regions comprising reactive composition (unless it has been previously removed using a suitable organic solvent as described for Electroless Plating Method 1).

Electroless Plating Method 3:

This method can be used to form a pattern in a polymeric layer, the method comprising:

providing a polymeric layer comprising a reactive composition that comprises: (1) a reactive polymer; (2) a compound that provides a cleaving acid; (3) a crosslinking agent that is capable of reacting in the presence of the cleaving acid, to provide crosslinking in the reactive polymer, and (4) optionally, a photosensitizer, all as described above, patternwise exposing the polymeric layer to radiation having a $\lambda_{max}$ of at least 150 nm that is sufficient to generate sulfonic acid groups and to induce crosslinking within the reactive polymer, to provide a polymeric layer comprising non-exposed regions and exposed regions comprising an at least partially crosslinked polymer derived from the reactive polymer, optionally heating the polymeric layer simultaneously with or after patternwise exposing the polymeric layer at a temperature sufficient to further generate sulfonic acid groups in the at least partially crosslinked polymer in the exposed regions of the polymeric layer, contacting both the non-exposed regions and the exposed regions of the polymeric layer with a reducing agent, bleaching the polymeric layer to remove surface amounts of the reducing agent in both non-exposed regions and exposed regions comprising crosslinked polymer, contacting the exposed regions of the polymeric layer with electroless seed metal ions to oxidize the reducing agent and to form a pattern of electroless seed metal particles in the exposed regions of the polymeric layer, and electrolessly plating the corresponding electroless seed metal particles in the exposed regions of the polymeric layer with a metal that is the same as or different from the corresponding electroless seed metal particles.

Thus, in this method that includes providing a polymeric layer (as in forming the described precursor article), the polymeric layer comprises a reactive composition as described above. This polymeric layer can be formed on a suitable substrate, if desired, as described above by suitable application of the reactive composition, after which the reactive composition is typically dried before the resulting precursor article is used in the method.

This polymeric layer in the precursor article, usually in dry form, can be then patternwise exposed to radiation having a $\lambda_{max}$ of at least 150 nm and up to and including 450 nm or to radiation having a $\lambda_{max}$ of at least 150 nm and up to and including 400 nm, as described above to provide a polymeric layer comprising non-exposed regions and exposed regions comprising the pendant sulfonic acid groups. This exposure can be provided using any suitable exposing source or device for suitable times as described above.

At any time after the patternwise exposing or optional heating procedures, the reactive composition remaining in the non-exposed regions of the polymeric layer can be removed using an organic solvent in which the polymeric layer comprising the reactive composition is soluble or dispersible, as described above in Electroless Plating Method 1.

In many embodiments, removing the reactive composition from the non-exposed regions of the polymeric layer is carried out immediately after the patternwise exposure and any optional heating procedure.

At this point, an intermediate article has been created in which the exposed regions of the polymeric layer on the substrate comprise crosslinked polymer derived from the reactive polymer in the reactive composition described above, and the non-exposed regions of the polymeric layer comprise little or no reactive composition.

After the exposure and optional heating, the exposed regions of the polymeric layer are contacted with an aqueous-based reducing solution containing one or more suitable reducing agents using aqueous-based solutions and conditions as described above. In the exposed regions, the reducing agent can diffuse into the crosslinked polymer. In the non-exposed regions, the reducing agent does not readily diffuse into the substrate wherein the non-exposed reactive composition has been removed but will become attached to the surface of the substrate.

After this reducing procedure, the polymeric layer, especially the exposed regions, can be again washed using distilled water or deionized water or another aqueous-based solution at a suitable temperature for a suitable time.

At this point, an intermediate article is provided, which intermediate article comprises a substrate and having disposed thereon a polymeric layer comprising exposed regions and non-exposed regions, the exposed regions comprising an at least partially crosslinked polymer derived from the reactive polymer in the reactive composition described above, into which a reducing agent has diffused, and the non-exposed regions comprising reducing agent attached to the reactive polymer in the reactive composition described above.

Optionally at this point, the reactive composition in the non-exposed regions of the polymeric layer can be removed (as described above) after this reducing procedure and before the oxidizing procedure described below. This would produce yet another intermediate article that would comprise exposed regions in the polymeric layer comprising diffused reducing agent within the de-blocked and crosslinked polymer resulting from irradiation, but the non-exposed regions of the polymeric layer would comprise little or no reactive composition.

Once patternwise exposure, optional heating, and the reducing procedure have been carried out, the polymeric layer can be contacted with an aqueous-based bleaching (or oxidizing) solution comprising one or more bleaching agents, thereby removing surface amounts of the reducing agent in both non-exposed regions comprising primarily the substrate after removal of the non-crosslinked reactive polymer, and exposed regions of the polymeric layer. The term "bleaching" refers to oxidizing the reducing agent molecules to make them inactive for further reaction (thus, they cannot reduce the seedless metal ions when bleached).

Useful bleaching agents for this bleaching procedure can be chosen depending upon the reducing agent that is used in the previous operation. Representative bleaching agents include but are not limited to, peroxides such as hydrogen peroxide, persulfates, iron(III) complexes, and combinations thereof. Hydrogen peroxide is particularly useful. In general, the one or more bleaching agents are present in the aqueous-based bleaching solution in an amount of at least 0.01 weight % and up to and including 20 weight %, based on total aqueous-based bleaching solution weight.

In general, bleaching the polymeric layer is carried out in sufficient time and temperature so that the aqueous-based bleaching solution reacts with (deactivates) or removes at least 90 mol % (or typically at least 95 mol %) of the reducing agent in the non-exposed regions and less than 40 mol % (or typically less than 25 mol %) in the exposed regions of the polymeric layer. The useful time and temperature conditions needed to achieve these results would be readily determined with routine experimentation in view of the teaching provided herein.

At this point, the present invention provides an intermediate article, comprising a substrate and having disposed thereon a polymeric layer comprising exposed regions and non-exposed regions, the exposed regions comprising a pattern of non-oxidized reducing agent molecules within the crosslinked polymer resulting from the irradiation of the reactive polymer in the reactive composition described herein, and the non-exposed regions comprising reactive composition as described herein.

Optionally, the reactive composition can be removed from the non-exposed regions of the polymeric layer as described above for Electroless Plating Method 1, leaving the partially oxidized reducing agent molecules in the exposed regions of the polymeric layer containing the de-blocked and crosslinked polymer derived from the reactive polymer in the reactive composition described above.

If this procedure is carried out, an intermediate article is created that comprises a substrate and having disposed thereon exposed regions of the polymeric layer containing de-blocked and crosslinked polymer derived from the reactive polymer in the reactive composition described herein, and non-exposed regions of the polymeric layer comprising little or no reactive composition, wherein the exposed regions further comprise partially oxidized reducing agent molecules within the de-blocked and crosslinked polymer.

Once the previous operations have been carried out, the exposed regions of the polymeric layer can be contacted with an aqueous-based solution or dispersion containing electroless seed metal ions to oxidize the reducing agent and to form corresponding electroless seed metal particles (for example in a pattern) in the exposed regions of the polymeric layer using aqueous-based solutions and conditions as described above. These corresponding electroless seed metal particles form catalytic sites for electroless metal plating (deposition of metal) described below.

The contact with the electroless seed metal ions produces an intermediate article comprising a substrate and having disposed thereon a polymeric layer comprising exposed regions and non-exposed regions, the exposed regions comprising a pattern of corresponding electroless seed metal particles within the crosslinked polymer resulting from irradiation of the reactive polymer in the reactive composition described herein, and the non-exposed regions comprising reactive composition as described above.

After the requisite time to react the electroless seed metal ions within the resulting crosslinked polymer in the exposed regions, the polymeric layer can be rinsed with distilled or deionized water or another aqueous-based solution for a suitable time and at a suitable temperature, usually room temperature or slightly higher.

Optionally at this point, the reactive composition can be removed from the non-exposed regions of the polymeric layer as described above for Electroless Plating Method 1, leaving the pattern of electroless seed metal in the exposed regions of the polymeric layer.

If this procedure is carried out, an intermediate article is created that comprises a substrate and having disposed thereon exposed regions of the polymeric layer containing a de-blocked and crosslinked polymer derived from the reactive polymer in the reactive composition, and non-exposed regions of the polymeric layer comprising little or no reactive composition, wherein the exposed regions further comprise a pattern of electroless seed metal coordinated within the de-blocked and crosslinked polymer.

The resulting intermediate article can be immediately immersed in an aqueous-based electroless plating bath or solution or it can be stored with just the catalytic pattern comprising electroless seed metal for use at a later time.

The article can be contacted with an electroless plating metal that is the same as or different from the electroless seed metal using aqueous-based solutions and conditions as described above for Electroless Plating Method 1. In most embodiments, the electroless plating metal is a metal different from the corresponding electroless seed metal particles.

After the electroless plating procedure, the product article is removed from the aqueous-based electroless plating bath and can again be washed using distilled water or deionized water or another aqueous-based solution to remove any residual electroless plating chemistry. At this point, the polymeric layer and electrolessly plated metal are generally stable and can be used for their intended purpose.

Optionally at this point, the reactive composition can be removed from the non-exposed regions of the polymeric layer after electrolessly plating the corresponding electroless seed metal particles so that the resulting product article comprises a pattern of electrolessly plated metal in the exposed regions of the polymeric layer but the product article comprises little or no reactive composition in the non-exposed regions of the polymeric layer.

Thus, this method provides a product article comprising a substrate and having disposed thereon a polymeric layer comprising exposed regions and non-exposed regions, the exposed regions comprising a pattern of a corresponding electroless seed metal particles within the crosslinked polymer derived from the reactive polymer in the reactive composition described herein, which has been electrolessly plated with the same or different metal, and the non-exposed regions comprising reactive composition.

Electroless Plating Method 4:

This method can be used to form a pattern in a polymeric layer, the method comprising:

providing a polymeric layer comprising a reactive composition that comprises: (1) a reactive polymer according to this invention; (2) a compound that provides a cleaving acid; (3) a crosslinking agent that is capable of reacting in the presence of the cleaving acid, to provide crosslinking in the reactive polymer; and (4) optionally, a photosensitizer, all as described above, patternwise exposing the polymeric layer to radiation having a $\lambda_{max}$ of at least 150 nm that is sufficient to induce generate pendant sulfonic acid groups within the reactive polymer, to provide a polymeric layer comprising non-exposed regions and first exposed regions comprising an at least partially crosslinked polymer derived from the reactive polymer, optionally heating the polymeric layer simultaneously with or after patternwise exposing the polymeric layer at a temperature sufficient to further generate sulfonic acid groups in the at least partially crosslinked polymer in the first exposed regions of the polymeric layer, contacting the first exposed regions of the polymeric layer with electroless seed metal ions to form electroless seed metal ions in the first exposed regions of the polymeric layer, contacting the first exposed regions of the polymeric layer with a halide to react with the electroless seed metal ions and to form corresponding electroless seed metal halide in the first exposed regions of the polymeric layer, optionally exposing the polymeric layer to convert at least some of the corresponding electroless seed metal halide in the first exposed regions to corresponding electroless seed metal particles and to form second exposed regions in the polymeric layer, optionally contacting the polymeric layer with a reducing agent either: (i) to develop the corresponding electroless seed metal image in the second exposed regions of the polymeric layer, or (ii) to develop all of the corresponding electroless seed metal halide in the first exposed regions, optionally contacting the polymeric layer with a fixing agent to remove any remaining corresponding electroless seed metal halide in either the first exposed regions, the second exposed regions, or both of the first exposed regions and the second exposed regions, and electrolessly plating the corresponding electroless seed metal particles in the first exposed regions, the second exposed regions, or both the first exposed regions and the second exposed regions, of the polymeric layer with a metal that is the same as or different from the corresponding electroless seed metal particles.

Such method is carried out by providing a polymeric layer (as in forming the described precursor article), the polymeric layer comprising the reactive composition described above and formed on a suitable substrate as described above by suitable application of the reactive composition, after which the reactive composition is typically dried before the resulting precursor article is used in the method described herein.

This polymeric layer in the precursor article, usually in dry form, can be then patternwise exposed to radiation having a $\lambda_{max}$ of at least 150 nm and up to and including 450 nm or to radiation having $\lambda_{max}$ of at least 150 nm and up to and including 400 nm, as described above to provide a polymeric layer comprising non-exposed regions and first exposed regions comprising a crosslinked polymer.

It is optional but desirable to heat or bake the reactive composition in the precursor article simultaneously with or after the patternwise exposure but generally before contacting the exposed polymeric layer with electroless seed metal ions (described below). Conditions and means for this heating or baking are described above for the Electroless Plating Method 1.

At any time after the patternwise exposing or optional heating procedures, the reactive composition remaining in the non-exposed regions of the polymeric layer can be removed using an organic solvent in which the polymeric layer comprising the reactive composition is soluble or dispersible, as described above for the Electroless Plating Method 1.

In many embodiments, removing the reactive composition in the non-exposed regions of the polymeric layer is carried out immediately after the patternwise exposure and any optional heating procedure.

At this point, an intermediate article has been created in which the exposed regions of the polymeric layer on the substrate comprise de-blocked and crosslinked polymer derived from the reactive polymer in the reactive composition described above, and the non-exposed regions of the polymeric layer comprise the reactive composition.

Generally immediately after the patternwise exposing or optional heating procedures, the reactive composition remaining in the non-exposed regions of the polymeric layer is removed as described above for other methods (at least 90 weight % of the original amount). Upon this removal of reactive composition from the non-exposed regions of the polymeric layer, the various articles described herein will contain crosslinked polymer in the exposed regions of the polymeric layer.

At this point, an intermediate article has been created in which the first exposed regions of the polymeric layer on the substrate comprise crosslinked polymer derived from the reactive polymer in the reactive composition as described above, and the non-exposed regions of the polymeric layer comprise substantially no reactive composition.

Once patternwise exposure and optional heating have been carried out, the first exposed regions of the polymeric layer are contacted with electroless seed metal ions to form coordinated electroless seed metal ions in the first exposed regions of the polymeric layer using aqueous-based solutions and conditions described above for the Electroless Plating Method 1.

The contact with the electroless seed metal ions produces an intermediate article comprising a substrate and having disposed thereon a polymeric layer comprising first exposed regions and non-exposed regions, the first exposed regions comprising a pattern of electroless seed metal ions within the crosslinked polymer resulting from irradiation of the reactive polymer in the reactive composition described above, and the non-exposed regions comprising the reactive composition.

After the requisite time to react the electroless seed metal ions within the crosslinked polymer in the first exposed regions, the polymeric layer can be rinsed with distilled or deionized water or another aqueous-based solution for a suitable time and at a suitable temperature, usually room temperature or slightly higher.

Optionally at this point, the reactive composition can be removed in the non-exposed regions as described above, leaving the pattern of electroless seed metal ions in the exposed regions of the polymeric layer containing the de-blocked and crosslinked polymer derived from the reactive polymer in the reactive composition described above.

If this procedure is carried out, an intermediate article is created that comprises a substrate and having disposed thereon exposed regions of a de-blocked and crosslinked polymeric layer and non-exposed regions of the polymeric layer comprising little or no reactive composition, wherein the exposed regions further comprise a pattern of electroless seed metal ions coordinated within the de-blocked and crosslinked polymer derived from the reactive polymer within the reactive composition described above.

At least the first exposed regions of the polymeric layer are then contacted with a halide that reacts with the seed metal ions to form corresponding electroless seed metal halide in the first exposed regions of the polymeric layer. Halides can be provided as suitable halide salts to provide iodide ions, chloride ions, or bromide ions or a combination of two or more of these halides to form electroless seed metal halide in the first exposed regions of the polymeric layer. Chloride ions, iodide ions, or bromide ions or mixtures thereof are particularly useful.

This contacting with a halide can be carried out by immersing the intermediate article described above within an aqueous-based halide bath or halide solution of a suitable halide salt, or the aqueous-based halide solution can be sprayed or coated onto the polymeric layer in a uniform or patternwise manner. The time for this halide treatment can be at least 1 second and up to and including 30 minutes, and the temperature for the halide treatment can be room temperature (about 20° C.) and up to and including 95° C. The time and temperature and the type and amount of halide in a treatment bath can be optimized in order to provide the sufficient amount of corresponding electroless seed metal halide in the first exposed regions of the polymeric layer.

At this point, an intermediate article has been created, which intermediate article comprises a substrate and having thereon a polymeric layer comprising first exposed regions and non-exposed regions, the first exposed regions of the polymeric layer comprising a pattern of corresponding electroless seed metal halide in the crosslinked polymer derived from the reactive polymer in the reactive composition described above, and the non-exposed regions comprising the reactive composition.

Optionally at this point, the reactive composition can be removed from the non-exposed regions as described above, leaving the pattern of electroless seed metal halide in the first exposed regions of the polymeric layer containing the de-blocked and crosslinked polymer derived from the reactive polymer in the reactive composition described herein.

If this procedure is carried out, an intermediate article is created that comprises a substrate and having disposed thereon first exposed regions of the polymeric layer containing a de-blocked and crosslinked polymer derived from the reactive polymer in the reactive composition described above, and non-exposed regions of the polymeric layer comprising little or no reactive composition, wherein the first exposed regions further comprise a pattern of electroless seed metal halide.

After this halide treatment, the polymeric layer can be optionally exposed again to convert at least some, or typically at least 20% (or more typically at least 50%), of the corresponding electroless seed metal halide in first exposed regions of the polymeric layer to corresponding electroless seed metal particles using radiation having a $\lambda_{max}$ of at least 150 nm and up to and including 450 nm, or more likely having a $\lambda_{max}$ of at least 150 nm and up to and including 330 nm. The second exposed regions can be the same as or different from the first exposed regions, or the first and second exposed regions can partially overlap.

After this second exposure, the method can provide yet another intermediate article comprising a substrate and having disposed thereon a polymeric layer comprising first exposed regions, second exposed regions, and non-exposed regions, the first exposed regions comprising corresponding electroless seed metal halide in the crosslinked polymer derived from the reactive polymer in the reactive composition described above, the second exposed regions comprising a pattern of corresponding electroless seed metal with a latent image in the crosslinked polymer derived from the reactive polymer in the reactive composition described above, and the non-exposed regions comprising a reactive composition as described above.

Optionally at this point, the reactive composition can be removed from the non-exposed regions as described above, leaving the pattern of electroless seed metal halide in the first exposed regions of the polymeric layer and a pattern of corresponding electroless seed metal halide with a latent image in the second exposed regions of the polymeric layer.

If this procedure is carried out, an intermediate article is created that comprises a substrate and has disposed thereon first exposed regions and second exposed regions of the polymeric layer containing a de-blocked and crosslinked polymer derived from the reactive polymer in the reactive composition described above, and non-exposed regions of the polymeric layer comprising little or no reactive composition, wherein the first exposed regions further comprise a pattern of electroless seed metal halide and the second exposed regions further comprise a pattern of electroless seed metal halide with a latent image.

The polymeric layer comprising corresponding electroless seed metal halide in the first exposed regions, or corresponding electroless seed metal latent image in the second exposed regions, or both corresponding electroless seed metal halide in the first exposed regions and corresponding electroless seed metal latent image in the second exposed regions are then optionally contacted with a suitable aqueous-based reducing solution comprising one or more reducing agents using aqueous-based solutions and conditions as described above.

After this reducing procedure, the polymeric layer, especially the first exposed regions or the second exposed regions, can be again washed using distilled water or deionized water or another aqueous-based solution for a suitable time to remove excess reducing agent.

The reducing procedure can provide another intermediate article that comprises a substrate and having thereon a polymeric layer comprising first exposed regions, second exposed regions, and non-exposed regions, the first exposed regions of the polymeric layer comprising a pattern of corresponding electroless seed metal halide in a crosslinked polymer derived from the reactive polymer in the reactive composition described above, the second exposed regions of the polymeric layer comprising a pattern of corresponding electroless seed metal particles in the crosslinked polymer derived from the reactive polymer in the reactive composition described above, and the non-exposed regions of the polymeric layer comprising the reactive composition.

Optionally at this point, the reactive composition can be removed from the non-exposed regions as described above, leaving a pattern of corresponding electroless seed metal halide in the first exposed regions of the polymeric layer and a pattern of corresponding electroless seed metal particles in the second exposed regions of the polymeric layer.

If this procedure is carried out, an intermediate article is created that comprises a substrate and has disposed thereon first exposed regions and second exposed regions of the polymeric layer containing a de-blocked and crosslinked polymer derived from the reactive polymer in the reactive composition, and non-exposed regions of the polymeric layer comprising little or no reactive composition, wherein the first exposed regions further comprise a pattern of corresponding electroless seed metal halide and the second exposed regions further comprise a pattern of electroless seed metal particles.

The polymeric layer comprising corresponding electroless seed metal halide in the first exposed regions, or corresponding electroless seed metal particles in the second exposed regions, or both corresponding electroless seed metal halide in the first exposed regions and corresponding electroless seed metal particles in the second exposed regions, are then optionally contacted with a suitable fixing agent. This contact removes any remaining corresponding electroless seed metal halide from both the first exposed regions and the second exposed regions of the polymeric layer, while leaving behind any corresponding electroless seed metal particles in the second exposed regions.

This contact with a fixing agent can be done by immersing the polymeric layer (or at least the first and second exposed regions) within an aqueous-based fixing solution containing one or more fixing agents for a suitable time to cause the desired change (removal of the corresponding electroless metal halide) in the first exposed regions and the second exposed regions. Alternatively, an aqueous-based fixing solution can be sprayed or rolled uniformly onto the polymeric layer to accomplish the same results.

Useful fixing agents include but are not limited to, sulfites, thiocyanates, thiosulfates, thioureas, halides, ammonia, chelates such as ethylenediaminetetracetic acid, and mixtures thereof. Fixing accelerators can also be included in the aqueous-based fixing solutions, which compounds include, but are not limited to, thioethers and mercaptotriazoles. The fixing agents can be present as salts (that is alkali metal or ammonium salts) as is well known in the art, for instance as described in *Research Disclosure* December 1978 publication 38957. The total amount of fixing agents in the aqueous-based fixing solution can be at least 0.01 weight % and up to and including 50 weight % based on total fixing solution weight. The fixing agent amount can be readily optimized using routine experimentation. The fixing time and temperature can also be readily optimized in the same manner. Generally, the fixing temperature is at least room temperature (about 20° C.) and up to and including 95° C. and the reducing time can be for at least 1 second and up to and including 30 minutes.

For example, some embodiments of the present invention can be carried out using an aqueous-based fixing solution comprising 20 solution weight % of sodium thiosulfate in combination with 1.5 solution weight % of sodium sulfite at room temperature for 3 minutes. Longer or shorter times at higher temperatures are possible.

After this fixing procedure, the polymeric layer, especially the first exposed regions or the second exposed regions, can be again washed using distilled water or deionized water or another aqueous-based solution for a suitable time to remove excess fixing agent.

The fixing procedure can provide another intermediate article that comprises a substrate and has thereon a polymeric layer comprising first exposed regions, second exposed regions, and non-exposed regions, the first exposed regions of the polymeric layer from which the pattern of corresponding electroless seed metal halide has been removed, the first exposed regions comprising the crosslinked polymer being derived from a reactive polymer in a reactive composition as described above, the second exposed regions of the polymeric layer comprising a pattern of corresponding electroless seed metal particles in the crosslinked polymer being derived from a reactive polymer in a reactive composition as described above, and the non-exposed regions of the polymeric layer comprising the reactive composition.

Optionally at this point, the reactive composition can be removed in the non-exposed regions as described above, leaving corresponding electroless seed metal particles in the second exposed regions of the polymeric layer containing a de-blocked and crosslinked polymer derived from the reactive polymer in the reactive composition described above.

If this procedure is carried out, an intermediate article is created that comprises a substrate and having disposed thereon first exposed regions and second exposed regions of the polymeric layer containing a de-blocked and crosslinked polymer derived from the reactive polymer in the reactive composition as described above, and non-exposed regions of the polymeric layer comprising little or no reactive composition, the first exposed regions comprising little or no corresponding electroless seed metal halide, and the second exposed regions comprising corresponding electroless seed metal particles in the de-blocked and crosslinked polymer derived from the reactive polymer in the reactive composition described above.

The intermediate article that has been treated as described above can be immediately immersed in an aqueous-based electroless metal plating bath or solution using conditions and aqueous-based solutions described above for the Electroless Plating Method 1, or the treated article can be stored with just the catalytic pattern comprising corresponding electroless seed metal particles for use at a later time.

The intermediate article can be contacted with an electroless plating metal that is the same as or different from the corresponding electroless seed metal particles. In most embodiments, the electroless plating metal is a metal different from the corresponding electroless seed metal particles.

After the electroless plating procedure, the resulting product article is removed from the aqueous-based electroless plating bath or solution and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising first exposed regions (and optional second exposed regions) and non-exposed regions, the first exposed regions comprising a pattern of corresponding electroless seed metal particles that have been electrolessly plated with the same or different metal in a crosslinked polymer derived from the reactive polymer in the reactive composition described herein, and the non-exposed regions comprising the reactive composition.

Optionally, the reactive composition can be removed from the non-exposed regions of the polymeric layer after electrolessly plating the corresponding electroless seed metal particles so that the resulting product article comprises a pattern of electrolessly plated metal in the first exposed regions of the polymeric layer containing a de-blocked and crosslinked polymer derived from the reactive polymer in the reactive composition described above, but the product article comprises little or no reactive composition in the non-exposed regions of the polymeric layer.

To change the surface of the electrolessly plated metal for visual or durability reasons, it is possible that a variety of post-treatments can be employed including surface plating of still another (third) metal such as nickel or silver on the "second" electrolessly plated metal (this procedure is sometimes known as "capping"), or the creation of a metal oxide, metal sulfide, or a metal selenide layer that is adequate to change the surface color and scattering properties without reducing the conductivity of the electroless plated (second) metal. Depending upon the metals used in the various capping procedures of the method, it may be desirable to treat the electrolessly plated metal with a seed metal catalyst in an aqueous-based seed metal catalyst solution to facilitate deposition of additional metals. Details for such procedures are provided above for the Electroless Plating Method 1.

Electroless Plating Method 5:

This method can be used to form a pattern in a polymeric layer, the method comprising:

providing a polymeric layer comprising a reactive composition that comprises: (1) a reactive polymer according to the present invention; (2) a compound that provides a cleaving acid; (3) a crosslinking agent that is capable of reacting in the presence of the cleaving acid, to provide crosslinking in the reactive polymer, and (4) optionally, a photosensitizer, as described above, patternwise exposing the polymeric layer to radiation having a $\lambda_{max}$ of at least 150 nm that is sufficient to induce generate pendant sulfonic acid groups and cause crosslinking within the reactive polymer, to provide a polymeric layer comprising non-exposed regions and exposed regions comprising an at least partially crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further generate sulfonic acid groups and to further crosslink the at least partially crosslinked polymer in the exposed regions of the polymeric layer, contacting the exposed regions of the polymeric layer with electroless seed metal ions to form a pattern of electroless seed metal ions in the exposed regions of the polymeric layer, optionally contacting the pattern of electroless seed metal ions in the exposed regions of the polymeric layer with a non-reducing reagent that reacts with the electroless seed metal ions to form an electroless seed metal compound that has a $pK_{sp}$ of less than 40, and electrolessly plating the electroless seed metal compound within the exposed regions of the polymeric layer with a metal that is the same as or different from the corresponding electroless seed metal compound.

Such method thus comprises providing a polymeric layer (as in forming the described precursor article), the polymeric layer comprising a reactive composition as described above. This polymeric layer can be formed on a suitable substrate, if desired as described above by suitable application of the reactive composition, after which the reactive composition is typically dried before the resulting precursor article is used in the method of the invention.

This polymeric layer in the precursor article, usually in dry form, can be then patternwise exposed as described above to radiation having a $\lambda_{max}$ of at least 150 nm and up to and including 450 nm or to radiation having a $\lambda_{max}$ of at least 150 nm and up to and including 400 nm, to provide a polymeric layer comprising non-exposed regions and exposed regions comprising pendant sulfonic acid groups in a crosslinked polymer.

It is optional but desirable to heat or bake the polymeric layer in the precursor article simultaneously with or after the patternwise exposure but generally before contacting the exposed polymeric layer with electroless seed metal ions (described below) using conditions described above.

At any time after the patternwise exposing or optional heating procedures, the reactive composition remaining in the non-exposed regions of the polymeric layer can be removed using an organic solvent in which the polymeric layer comprising the reactive composition is soluble or dispersible as described above for the Electroless Plating Method 1.

In many embodiments, removing the reactive composition in the non-exposed regions of the polymeric layer is carried out immediately after the patternwise exposure and any optional heating procedure.

At this point, an intermediate article has been created in which the exposed regions of the polymeric layer on the substrate comprise crosslinked polymer derived from the reactive polymer in the reactive composition described above, and the non-exposed regions of the polymeric layer comprise substantially no reactive composition.

Then, the exposed regions of the polymeric layer are contacted with electroless seed metal ions to form coordinated electroless seed metal ions in the exposed regions of the polymeric layer using aqueous-based solutions and conditions as described above.

The contact with the electroless seed metal ions produces an intermediate article comprising a substrate and having disposed thereon a polymeric layer comprising exposed regions and non-exposed regions, the exposed regions comprising a pattern of electroless seed metal ions within the crosslinked polymer resulting from the irradiation of the reactive polymer in the reactive composition described herein, and the non-exposed regions comprise the reactive composition as described above.

After the requisite time to react the electroless seed metal ions within the crosslinked polymer in the exposed regions, the polymeric layer can be rinsed with distilled or deionized water or another aqueous-based solution for a suitable time and at a suitable temperature, for example usually room temperature or slightly higher.

Optionally at this point, the reactive composition can be removed from the non-exposed regions of the polymeric layer as described above, leaving the pattern of electroless seed metal ions in the exposed regions of the polymeric layer containing the de-blocked and crosslinked polymer derived from the reactive polymer in the reactive composition as described above.

If this procedure is carried out, an intermediate article is created that comprises a substrate and having disposed thereon exposed regions of the polymeric layer containing a de-blocked and crosslinked polymer derived from the reactive polymer in the reactive composition described above, and non-exposed regions of the polymeric layer comprising little or no reactive composition, wherein the exposed regions further comprise a pattern of electroless seed metal ions coordinated within the de-blocked and crosslinked polymer.

The electroless seed metal ions in the exposed regions of the polymeric layer are then contacted with a non-reducing reagent that reacts with the electroless seed metal ions to form an electroless seed metal compound (containing the non-reducing reagent) deposited within the exposed regions of the polymeric layer containing the crosslinked polymer derived from the reactive polymer in the reactive composition described above.

Useful non-reducing reagents include any compound that will covalently, ionically, or otherwise bond to or react with the electroless seed metal ions to form the electroless seed metal compound. Useful non-reducing reagents include those that provide electroless seed metal compounds having a $pK_{sp}$ value of less than 40, and for example, a $pK_{sp}$ that is greater than 4 and less than 40. For example, such useful non-reducing reagents include but are not limited to, alkali metal and ammonium hydroxides, thiosulfates, thiocyanates, sulfites, small organic acids, and combinations thereof. Halides are also useful non-reducing reagents for this invention. Alkali metal hydroxides are particularly useful including mixtures thereof.

This contacting procedure can be carried out in various ways including immersing the intermediate article in an aqueous-based non-reducing solution comprising one or more non-reducing reagents at a concentration of at least 1 weight % based on total aqueous-based non-reducing solution weight. Alternatively, an aqueous-based non-reducing solution can be sprayed or coated onto the polymeric layer in the intermediate article. The time and temperature for this contacting would be readily apparent to one skilled in the art in order to best achieve the desired bonding. For example, the contacting can be carried out at room temperature (about 20° C.) and up to and including 95° C. and the time can be for at least 1 second and up to and including 30 minutes.

After this contact with the non-reducing reagent, the polymeric layer, especially the exposed regions, can be again washed using distilled water or deionized water or another aqueous-based solution under suitable conditions of time and temperature.

At this stage, another intermediate article has been created, which intermediate article comprises a substrate and having disposed thereon a polymeric layer comprising exposed regions and non-exposed regions, the exposed regions of the polymeric layer comprising a pattern of an electroless seed metal compound (comprising a non-reducing reagent as described above) and a crosslinked polymer derived from the reactive polymer in the reactive composition described above, wherein the electroless seed metal compound has a $pK_{sp}$ of less than 40, and the non-exposed regions comprise the reactive composition as described above.

Optionally at this point, the reactive composition can be removed from the non-exposed regions of the polymeric layer as described above, leaving the pattern of electroless seed metal compound in the exposed regions of the polymeric layer containing the de-blocked and crosslinked polymer derived from the reactive polymer in the reactive composition described above.

If this procedure is carried out, an intermediate article is created that comprises a substrate and having disposed thereon exposed regions of the polymeric layer containing a de-blocked and crosslinked polymer derived from the reactive polymer in the reactive composition described above, and non-exposed regions of the polymeric layer comprising little or no reactive composition, wherein the exposed regions further comprise a pattern of electroless seed metal compound (comprising the non-reducing compound as described above).

This intermediate article can be immediately immersed in an aqueous-based electroless metal plating bath or solution, or the intermediate article can be stored with just the catalytic pattern comprising electroless seed metal compound for use at a later time.

The intermediate article can be contacted with an electroless plating metal that is the same as or different from the metal within the electroless seed metal compound using the aqueous-based solutions and conditions described above for the Electroless Plating Method 1. In most embodiments, the electroless plating metal is a different metal from the metal within the electroless seed metal compound.

After the electroless plating procedure, the product article is removed from the aqueous-based electroless plating bath or solution and can again be washed using distilled water or deionized water or another aqueous-based solution to remove any residual electroless plating chemistry. At this point, the polymeric layer and electrolessly plated metal are generally stable and can be used for their intended purpose.

This method provides a product article comprising a substrate and having disposed thereon a polymeric layer comprising exposed regions and non-exposed regions, the exposed regions comprising a pattern of an electroless seed metal compound (comprising a non-reducing reagent as described above) which has been electrolessly plated with the same or different metal that is part of the electroless seed metal compound within a crosslinked polymer derived from the reactive polymer in the reactive composition described above, and the non-exposed regions comprising the reactive composition as described above.

Optionally at this point, the reactive composition can be removed from the non-exposed regions of the polymeric layer after electrolessly plating the corresponding electroless seed metal compound so that the resulting article comprises a pattern of an electroless seed metal compound (comprising a non-reducing reagent as described above) that has been electrolessly plated with the same or different metal that is part of the electroless seed metal compound, within the de-blocked and crosslinked polymer derived from the reactive polymer in the reactive composition described above, but the product article comprises little or no reactive composition in the non-exposed regions of the polymeric layer.

To change the surface of the electroless plated metal for visual or durability reasons, it is possible that a variety of post-treatments can be employed including surface plating of still another (third) metal such as nickel or silver on the "second" electrolessly plated metal (this procedure is sometimes known as "capping"), or the creation of a metal oxide, metal sulfide, or a metal selenide layer that is adequate to change the surface color and scattering properties without reducing the conductivity of the electrolessly plated (second) metal. Depending upon the metals used in the various capping procedures of the method, is may be desirable to treat the electrolessly plated metal with a seed metal catalyst in an aqueous-based seed metal catalyst solution to facilitate deposition of additional metals.

Alternatively, the resulting product article can undergo further treatment to decompose any residual onium salt on the polymeric layer or to change the visual characteristics and or durability of the electrolessly plated metal. For example, to decompose any remaining onium salt or other cleaving acid-generating compound, the polymeric film can be uniformly exposed or blanket flashed with ultraviolet radiation and baked (or heated) similarly as described above after the initial exposure. Details of these procedures are provided above for the Electroless Plating Method 1.

The present invention provides at least the following embodiments and combinations thereof, but other combinations of features are considered to be within the present invention as a skilled artisan would appreciate from the teaching of this disclosure:

1. A polymer comprising (a) recurring units that are represented by the following Structure (A):

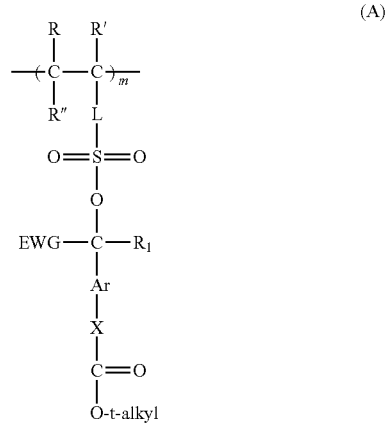

wherein:
R, R', and R" are independently hydrogen or an alkyl, cyano, or halo group,
$R_1$ is hydrogen or a halo, substituted or unsubstituted alkyl, substituted or unsubstituted cycloalkyl, cyano, hydroxy, alkoxy, carboxy, or ester group,
L is an organic linking group,
EWG represents an electron withdrawing group having a Hammett-sigma value greater than or equal to 0.35 such that the oxygen-carbon bond in O—C(EWG)($R_1$) is cleavable in the presence of a cleaving acid having a $pK_a$ of 2 or less as measured in water,
Ar is a substituted or unsubstituted arylene group,
X is $NR_2$ or oxygen,
$R_2$ is hydrogen or an alkyl group,
t-alkyl represents a tertiary alkyl group having 4 to 6 carbon atoms, and
m represents at least 1 mol % and up to and including 100 mol %, based on the total recurring units in the polymer.

2. The polymer of embodiment 1, wherein R, R', and R" are independently hydrogen, methyl, ethyl, or chloro, $R_1$ is hydrogen, methyl, ethyl, or halo-substituted methyl, X is oxygen, EWG represents a trifluoroalkyl group having 1 to 3 carbon atoms, a trichloroalkyl group having 1 to 3 carbon atoms, cyano, nitro, carboxylic acid, or a carboxylic acid ester, Ar is substituted or unsubstituted phenylene, and t-alkyl represents a tertiary alkyl group having 4 or 5 carbon atoms.

3. The polymer of embodiment 1 or 2, wherein EWG represents a trichloromethyl group or a trifluoromethyl group, Ar is unsubstituted phenylene, and t-alkyl represents a tertiary butyl group.

4. The polymer of any of embodiments 1 to 3, wherein L is a carbonyloxyalkylene group having 1 to 10 carbon atoms in the alkylene chain or a substituted or unsubstituted arylene group.

5. The polymer of any of embodiments 1 to 4, wherein m represents at least 10 mol % and up to and including 95 mol %, based on total recurring units in the polymer.

6. The polymer of any of embodiments 1 to 5 further comprising (b) recurring units comprising pendant groups that provide crosslinking in the presence of the cleaving acid having a $pK_a$ of 2 or less as measured in water.

7. The polymer of embodiment 6, wherein the (b) recurring units are present in an amount of at least 1 mol % based on the total recurring units in the polymer.

8. The polymer of embodiment 6 or 7, wherein the (b) recurring units comprise pendant glycidyl groups and are present in an amount of at least 1 mol % and up to and including 50 mol %, based on the total recurring units in the polymer.

9. The polymer of any of embodiments 6 to 8 further comprising additional (c) recurring units that are different from all (a) and (b) recurring units, wherein the additional (c) recurring units are present in an amount of at least 1 mol % and up to and including 50 mol %, based on the total recurring units in the polymer.

10. The polymer of any of embodiments 1 to 9, wherein R, R', and R" are independently hydrogen or methyl, $R_1$ is hydrogen or methyl, L is a carbonyloxyalkylene group having 1 to 10 carbon atoms or a substituted or unsubstituted arylene group, EWG represents a trichloromethyl or trifluoromethyl group, X is oxygen, Ar is a substituted or unsubstituted phenylene group, and t-alkyl represents a tertiary alkyl group having 4 or 5 carbon atoms.

11. The polymer of any of embodiments 1 to 10, wherein EWG represents trifluoromethyl, Ar is an unsubstituted phenylene group, and t-alkyl represents a tertiary butyl group.

12. A method for forming a pattern in a polymeric layer, the method comprising:
providing a polymeric layer comprising a reactive composition that comprises:
(1) a reactive polymer comprising (a) recurring units in an amount of at least 10 mol % based on the total reactive polymer recurring units;
(2) a compound that provides a cleaving acid upon exposure to radiation having a $\lambda_{max}$ of at least 150 nm and up to and including 450 nm, which cleaving acid has a $pK_a$ of 2 or less as measured in water;
(3) a crosslinking agent that is capable of reacting in the presence of the cleaving acid, to provide crosslinking in the reactive polymer; and
(4) optionally, a photosensitizer,
patternwise exposing the polymeric layer to radiation having a $\lambda_{max}$ of at least 150 nm and up to and including 450 nm, to provide a polymeric layer comprising non-exposed regions and exposed regions comprising a polymer comprising sulfonic acid groups (sulfonate groups),
optionally heating the polymeric layer simultaneously with or after patternwise exposing the polymeric layer but before contacting the exposed regions of the polymeric layer with electroless seed metal ions, at a temperature sufficient to further generate sulfonic acid groups (or sulfonate groups) in the reactive polymer in the exposed regions of the polymeric layer,
contacting the exposed regions of the polymeric layer with electroless seed metal ions to form a pattern of electroless seed metal ions in the exposed regions of the polymeric layer,
reducing the pattern of electroless seed metal ions to provide a pattern of corresponding electroless seed metal particles in the exposed regions of the polymeric layer, and
electrolessly plating the corresponding electroless seed metal particles in the exposed regions of the polymeric layer with a metal that is the same as or different from the corresponding electroless seed metal particles,
wherein the reactive polymer comprises (a) recurring units defined in any of embodiments 1 to 11.

13. The method of embodiment 12, wherein the (2) compound is an arylsulfonium salt or aryliodonium salt that provides the cleaving acid having a $pK_a$ of 2 or less as measured in water.

14. The method of embodiment 12 or 13, further comprising:
heating the polymeric layer simultaneously or immediately after patternwise exposing the polymeric layer at a temperature sufficient to further generate sulfonic acid groups (sulfonate groups) in the reactive polymer in the exposed regions of the polymeric layer.

15. The method of any of embodiments 12 to 14, comprising contacting the exposed regions in the polymeric layer with electroless seed metal ions selected from the group consisting of silver ions, platinum ions, palladium ions, gold ions, rhodium ions, nickel ions, iridium ions, tin ions, and copper ions.

16. The method of any of embodiments 12 to 15, comprising electrolessly plating with a metal that is selected from the group consisting of copper(II), silver(I), gold(IV), palladium (II), platinum(II), nickel(II), chromium(II), and combinations thereof.

17. The method of any of embodiments 12 to 16, comprising reducing the electroless seed metal ions in the exposed regions of the polymeric layer with a reducing agent that is a borane, aldehyde, hydroquinone, or sugar reducing agent.

18. A precursor article used in the method of any of embodiments 12 to 17, the precursor article comprising a substrate and having disposed thereon a polymeric layer comprising a reactive composition that comprises:
(1) a reactive polymer comprising (a) recurring units in an amount of at least 10 mol % based on the total reactive polymer recurring units;
(2) a compound that provides a cleaving acid upon exposure to radiation having a $\lambda_{max}$ of at least 150 nm and up to and including 450 nm, which cleaving acid has a $pK_a$ of 2 or less as measured in water;
(3) a crosslinking agent that is capable of reacting in the presence of the cleaving acid, to provide crosslinking in the reactive polymer; and
(4) optionally, a photosensitizer,
wherein the reactive polymer is defined as in any of embodiments 1 to 11.

19. An intermediate article formed during the method of any of embodiments 12 to 17, the intermediate article comprising a substrate and having disposed thereon a polymeric layer comprising exposed regions and non-exposed regions,
the exposed regions comprising a pattern of polymer comprising pendant sulfonic acid groups, which polymer has been derived from a reactive polymer comprising (a) recurring units, and
the non-exposed regions comprising a reactive composition that comprises:
(1) the reactive polymer comprising (a) recurring units in an amount of at least 10 mol % based on the total reactive polymer recurring units;
(2) a compound that provides a cleaving acid upon exposure to radiation having a $\lambda_{max}$ of at least 150 nm and up to and including 450 nm, which cleaving acid has a $pK_a$ of 2 or less as measured in water;
(3) a crosslinking agent that is capable of reacting in the presence of the cleaving acid, to provide crosslinking in the reactive polymer; and
(4) optionally, a photosensitizer,
wherein the reactive polymer is defined in any of embodiments 1 to 11.

20. An intermediate article formed in the method of any of claims 12 to 17, the intermediate article comprising a substrate and having disposed thereon a polymeric layer comprising exposed regions and non-exposed regions,
the exposed regions comprising a pattern of electroless seed metal ions complexed within a polymer comprising pendant sulfonic acid groups (or sulfonate groups), which polymer has been derived from a reactive polymer, and
the non-exposed regions comprising a reactive composition that comprises:
(1) the reactive polymer comprising (a) recurring units in an amount of at least 10 mol % based on the total reactive polymer recurring units;
(2) a compound that provides a cleaving acid upon exposure to radiation having a $\lambda_{max}$ of at least 150 nm and up to and including 450 nm, which cleaving acid has a $pK_a$ of 2 or less as measured in water;
(3) a crosslinking agent that is capable of reacting in the presence of the cleaving acid, to provide crosslinking in the reactive polymer; and
(4) optionally, a photosensitizer,
wherein the reactive polymer is defined in any of embodiments 1 to 11.

21. An intermediate article formed in the method of any of claims 12 to 17, the intermediate article comprising a substrate and having disposed thereon a polymeric layer comprising exposed regions and non-exposed regions,
the exposed regions comprising a pattern of electroless seed metal particles complexed within a polymer comprising pendant sulfonic acid groups (or sulfonate groups), which polymer has been derived from a reactive polymer, and
the non-exposed regions comprising a reactive composition that comprises:
(1) the reactive polymer comprising (a) recurring units in an amount of at least 10 mol % based on the total reactive polymer recurring units;
(2) a compound that provides a cleaving acid upon exposure to radiation having a $\lambda_{max}$ of at least 150 nm and up to and including 450 nm, which cleaving acid has a $pK_a$ of 2 or less as measured in water;
(3) a crosslinking agent that is capable of reacting in the presence of the cleaving acid, to provide crosslinking in the reactive polymer; and
(4) optionally, a photosensitizer,
wherein the reactive polymer is defined in any of embodiments 1 to 11.

22. A product article formed using the method of any of embodiments 12 to 17, the product article comprising a substrate and having disposed thereon a polymeric layer comprising exposed regions and non-exposed regions,
the exposed regions comprising a pattern of electrolessly plated metal complexed within or deposited on the surface of a polymer comprising pendant sulfonic acid groups (or sulfonate groups), which polymer has been derived from a reactive polymer, and
the non-exposed regions comprising a reactive composition that comprises:
(1) the reactive polymer comprising (a) recurring units in an amount of at least 10 mol % based on the total reactive polymer recurring units;
(2) a compound that provides a cleaving acid upon exposure to radiation having a $\lambda_{max}$ of at least 150 nm and up to and including 450 nm, which cleaving acid has a $pK_a$ of 2 or less as measured in water;
(3) a crosslinking agent that is capable of reacting in the presence of the cleaving acid, to provide crosslinking in the reactive polymer; and (4) optionally, a photosensitizer, wherein the reactive polymer is defined in any of embodiments 1 to 11.

The following Examples are provided to illustrate the practice of this invention and are not meant to be limiting in any manner. Several compounds including novel monomer and copolymer were synthesized for use in the method of this invention.

Synthesis of 4-t-butoxycarbonyloxybenzaldehyde

4-Hydroxybenzaldehyde (15.0 g) was dissolved in about 250 ml of acetonitrile in a 500 ml single-neck flask followed by addition of 25.5 g of di-t-butyldicarbonate. Following this, 32.3 g of potassium carbonate were then added to the solution that was stirred under nitrogen at room temperature. After about 15 minutes, the solvent started to bubble and react vigorously. After the reaction subsided, the solid was filtered and the filtrate evaporated to dryness. Heptane was added to the oil that remained and crystallization was started by placing the flask on dry ice/acetone. It was then set in the freezer overnight to complete crystallization and 25.93 g of white crystals were collected and verified by NMR to be the desired reaction product.

Synthesis of (4-t-butoxycarbonyloxy)-α-trifluoromethylbenzyl Alcohol

The 4-t-butoxycarbonyloxybenzaldehyde prepared above (5 g) was dissolved in about 50 ml of tetrahydrofuran (THF) followed by the addition of 4.25 g of trimethyl(trifluoromethyl)silane. The reaction mixture was cooled with ice-acetone and then a catalytic amount of tetrabutylammonium fluoride (TBAF) (~1 drop/mmol) was added dropwise. The reaction mixture was stirred at 0° C. for about 15 minutes and then allowed to warm to room temperature over about an hour. The solvent was evaporated and dried under high vacuum to yield a yellow viscous oil that was purified by chromatography (silica gel: 90/10 heptane/ethyl acetate), and dried under high vacuum to obtain a clear colorless oil. The trimethylsilyl protecting group of the reaction product was cleaved by dissolving the oil in 100 ml of a 1:1 mixture of THF and 1 molar aqueous hydrochloric acid while being stirred at room temperature for 2 hours. The mixture was poured into about 300 ml of water and then ethyl acetate was added, followed by stirring for about one hour. The mixture was transferred to a separatory funnel and extracted 2 more times with ethyl acetate. The organic compounds were combined and washed with a 0.1 molar HCl solution, water, brine, and then dried over magnesium sulfate. Evaporation of the solvent produced a white solid. Hexane was added to the white solid that was then set in the freezer overnight to finish crystallizing to collect 3.43 g (78%; 56% overall yield) of white crystals of the desired compound.

Preparation of 3-[(4-t-butoxycarbonyloxy)-α-trifluoromethylbenzylsulfo]propyl methacrylate Monomer (4-t-Butoxycarbonyloxy)-α-trifluoromethylbenzyl alcohol (3.0 g) prepared as described above was dissolved in about 50 ml of methylene chloride in a 250 ml single-neck round bottom flask followed by addition of 2.86 ml of triethylamine. The reaction solution was cooled in an ice-acetone bath and 2.56 g of 3-chlorosulfopropyl methacrylate (prepared from 3-sulfopropyl methacrylate by standard methods) dissolved in about 15 ml of methylene chloride were added dropwise. The reaction solution was stirred at 0° C. for about an hour and then allowed to warm to room temperature over about 3 hours. Water was added with stirring for about 20 minutes. The reaction solution was transferred to a separatory funnel and extracted. The organic compounds were combined, washed with water, and dried over magnesium sulfate. The solution was evaporated to dryness leaving an oil that started to crystallize. Heptane and a small amount of ethyl acetate were added and swirled until a white solid was precipitated, which white solid was set in the freezer overnight to collect 4.85 g of white crystals of the desired ethylenically unsaturated polymerizable monomer.

Preparation of Electroless Copper Plating Bath

The following components were dissolved in a glass container that was cleaned with concentrated nitric acid followed by a thorough rinse with distilled water to eliminate any trace of metal on the glass: 1.8 g of copper (II) sulfate pentahydrate, 6.25 g of tetrasodium EDTA (ethylenediaminetetraacetic acid) tetrahydrate, 0.005 g of potassium ferrocyanide trihydrate, 2.25 g of a 37 weight % formaldehyde solution, 80 g of distilled water, and about 2 to 3 g of 45 weight % of a sodium hydroxide solution to adjust the pH to 12.8.

Preparation of the Electroless Nickel Plating Bath

The following components were dissolved in a glass container that was pre-cleaned with concentrated nitric acid followed by a thorough rinse with distilled water to eliminate any trace of metal on the glass: 0.36 g of nickel (II) sulfate hexahydrate, 3.37 g of 85 weight % lactic acid solution, 1.42 g of glacial acetic acid, 0.26 g of propionic acid, 0.25 ppm of thiourea, 100 ppm of methanol solution, 2.835 g of 14 molar ammonium hydroxide, 78.24 g of distilled water, and about 1.8 g of sodium hypophosphite partial hydrate (assume 95% anhydrous) added immediately before use.

Invention Example 1

Preparation of a Reactive Polymer A from 3-[(4-t-butoxycarbonyloxy)-α-trifluoromethylbenzylsulfo] propyl methacrylate and glycidyl methacrylate in an 85:15 mol Ratio 3-[(4-t-Butoxycarbonyloxy)-α-trifluoromethylbenzylsulfo]propyl methacrylate monomer prepared above (2.05 g) and 0.11 g of glycidyl methacrylate were weighed out in a 100 ml single-neck round bottom flask and then dissolved in THF and chloroform to obtain a 20 weight % solids solution. With solution still cloudy, 0.03 g of 2,2'-azodi(2-methylbutyronitrile) (AMBN) initiator was added and the reaction solution was purged with nitrogen for about 30 minutes, capped with a septum, and placed in a preheated oil bath at 65° C. overnight. The reaction solution cleared during heating and was cooled and precipitated into ethanol, filtered, and dried. The resulting white solid was then dissolved in THF, precipitated into ethanol, filtered, and dried in a high vacuum oven at room temperature overnight. The resulting Reactive Polymer A had a weight average molecular weight of 51,600 as determined by size exclusion chromatography, and readily dissolved in MEK to form a clear solution suitable for coating. A follow-up preparation carried out at 25% solids and 70° C. provided a Reactive Polymer A with a weight average molecular weight of 85,600 and that readily dissolved in MEK at 35 weight % to form a clear solution suitable for coating or further dilution with MEK to the desired coating viscosity.

Comparative Example

Showing Criticality of Strong Electron Withdrawing Group at the Benzyl Carbon

Attempted Synthesis of 3-[(4-t-butoxycarbonyloxy)-α-methylbenzylsulfo]propyl methacrylate Monomer 4-Hydroxy-α-methylbenzyl alcohol (5.0 g) and 7.5 g of di-t-butyldicarbonate were dissolved in 120 ml of acetonitrile followed by the addition of 9.5 g of potassium carbonate. After 2 days of reaction, the resulting precipitate was filtered, the filtrate was evaporated and the product was recrystallized from hexane to obtain 5.87 g (72% theoretical yield) of a white solid that was verified by NMR as the desired (4-t-butoxycarbonyloxy)-α-methylbenzyl alcohol product.

Five grams of this (4-t-butoxycarbonyloxy)-α-methylbenzyl alcohol was dissolved in about 100 ml of methylene chloride in a 250 ml single-neck round bottom flask followed by addition of 5.85 ml of triethylamine. The reaction mixture was cooled in an ice-acetone bath and to it were added dropwise 5.23 g of 3-chlorosulfopropyl methacrylate (prepared from 3-sulfopropyl methacrylate by standard methods) dissolved in about 50 ml of methylene chloride. The reaction solution was stirred at 0° C. for about an hour and then allowed to warm to room temperature over about 4 hours. Water was added and the solution was stirred for about 18 hours, and then transferred to a separatory funnel and extracted. The organics were combined and washed with water and dried over magnesium sulfate. The organic phase was evaporated to dryness leaving an oil, heptane was added, and the solution was set in the freezer overnight. Evaporated solvent and NMR showed the desired product was never formed or it had formed and then decomposed.

These synthetic results indicate that the strong electron withdrawing character of the α-trifluoromethyl group is critical to the stability of the ethylenically unsaturated polymerizable monomer and any subsequent polymer formed therefrom.

Invention Example 2

Preparation of Reaction Polymer B from 3-[(4-t-butoxycarbonyloxy)-α-trifluoromethylbenzylsulfo]propyl methacrylate, glycidyl methacrylate, and t-butyl methacrylate (64:15:21 mol Ratio)

3-[(4-t-Butoxycarbonyloxy)-α-trifluoromethylbenzylsulfo]propyl methacrylate monomer prepared above (3.85 g), 0.37 g of t-butyl methacrylate, and 0.27 g of glycidyl methacrylate were weighed out in a 100 ml single-neck round bottom flask and then dissolved in THF to obtain a 25 weight % solids solution. Then, 0.061 g of 2,2'-azodi(2-methylbutyronitrile) (AMBN) initiator was added and the reaction solution was purged with nitrogen for about 30 minutes, capped with a septum, and placed in a preheated oil bath at 65° C. overnight. The reaction solution cleared during heating and was cooled and precipitated into ethanol, filtered, and dried. The resulting white solid was then dissolved in THF, precipitated into ethanol, filtered, and dried in a high vacuum oven at room temperature overnight. The resulting Reactive Polymer B had a weight average molecular weight of 68,500 as determined by size exclusion chromatography, and readily dissolved in MEK to form a clear 35 weight % solids solution.

Invention Examples 3 and 4

Preparation of Reactive Composition Films and Electrically-Conductive Copper Patterns Reactive Polymers A (for Invention Example 3) and B (for Invention Example 4) described above were dissolved in MEK to form 5 weight % reactive compositions along with 0.2 weight % of (methylphenyl)diphenylsulfonium triflate salt (a monomer unit to onium salt molar ratio of 25:1). Each of the resulting reactive compositions was filtered and spin coated at 1200 RPM onto a substrate formed from poly(ethylene terephthalate) film with a polymeric adhesion layer of a polymer derived from glycidyl methacrylate and butyl acrylate that was applied before stretching as previously described, to form polymeric films on the substrate.

Each of the resulting precursor articles was exposed to short ultraviolet light through a chrome-on-quartz contact mask for 30 seconds, followed by contact with a vacuum hotplate at 110° C. for 1 to 2 minutes. Each resulting intermediate article was then immersed in a 0.4 molar silver nitrate solution for 5 minutes, rinsed in distilled water, immersed in a 1 weight % dimethylamine borane (DMAB) bath for 1 minute, and followed by a distilled water rinse. The resulting intermediate articles were then individually immersed in the electroless copper plating bath described above for 4 minutes. Brilliant continuous copper was formed in all exposed regions of each of the resulting product articles with line widths of 5 to 6 μm diameter were faithfully reproduced and showed high electrical conductivity.

This procedure was repeated three times over the course of 6 weeks using the same batch of 35 weight % Reactive Polymer A dissolved in MEK. The results were not statistically different over the 6 week period indicating that the reactive composition was stable when held at room temperature for at least 6 weeks.

Invention Example 5

Preparation of Polymer Films and Electrically-Conductive Nickel Patterns

Reactive Polymer A (described above) was dissolved in MEK to form a 5 weight % solution along with 0.2 weight % of (methylphenyl)diphenylsulfonium triflate salt (to provide a monomer unit to onium salt molar ratio of 25:1). The resulting reactive composition was filtered and spin coated at 1200 RPM onto a PET (polyethylene terephthalate) film with a polymeric adhesion layer comprised of a copolymer derived from glycidyl methacrylate and butyl acrylate that had been applied to the PET film before stretching as previously described, to provide a polymeric layer on the substrate.

The resulting precursor article was exposed to short ultraviolet light through a chrome-on-quartz contact mask for 8 seconds, followed by contact with a vacuum hotplate at 110° C. for 90 seconds. The resulting intermediate article was then immersed in a 0.001 M palladium chloride solution in 50:50 acetonitrile and water for 2 minutes, rinsed in distilled water, immersed in a 1 weight % dimethylamine borane (DMAB) bath for 1 minute, and rinsed with distilled water. This intermediate article was then immersed in the electroless nickel plating bath described above at 55° C. for 10 minutes. An electrically-conductive black nickel pattern was formed in all areas of the precursor article that has been exposed to the UV radiation. Line widths of 5 to 6 μm diameter were successfully reproduced.

The invention has been described in detail with particular reference to certain preferred embodiments thereof, but it will be understood that variations and modifications can be effected within the spirit and scope of the invention.

The invention claimed is:

1. A method for forming a pattern in a polymeric layer, the method comprising:
providing a polymeric layer comprising a reactive composition that comprises:
(1) a reactive polymer comprising (a) recurring units in an amount of at least 10 mol % based on the total reactive polymer recurring units;
(2) a compound that provides a cleaving acid upon exposure to radiation having a $\lambda_{max}$ of at least 150 nm and up to and including 450 nm, which cleaving acid has a $pK_a$ of 2 or less as measured in water;
(3) a crosslinking agent that is capable of reacting in the presence of the cleaving acid, to provide crosslinking in the reactive polymer; and
(4) optionally, a photosensitizer,
patternwise exposing the polymeric layer to radiation having a $\lambda_{max}$ of at least 150 nm and up to and including 450 nm, to provide a polymeric layer comprising non-exposed regions and exposed regions comprising a polymer comprising sulfonic acid groups or sulfonate groups,
optionally heating the polymeric layer simultaneously with or after patternwise exposing the polymeric layer but before contacting the exposed regions of the polymeric layer with electroless seed metal ions, at a temperature sufficient to further generate sulfonic acid groups or sulfonate groups in the reactive polymer in the exposed regions of the polymeric layer,
contacting the exposed regions of the polymeric layer with electroless seed metal ions to form a pattern of electroless seed metal ions in the exposed regions of the polymeric layer,
reducing the pattern of electroless seed metal ions to provide a pattern of corresponding electroless seed metal particles in the exposed regions of the polymeric layer, and
electrolessly plating the corresponding electroless seed metal particles in the exposed regions of the polymeric layer with a metal that is the same as or different from the corresponding electroless seed metal particles,
wherein the reactive polymer comprises (a) recurring units represented by the following Structure (A):

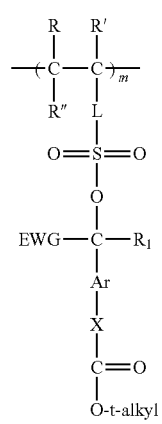

(A)

wherein:
R, R', and R" are independently hydrogen or an alkyl, cyano, or halo group,
$R_1$ is hydrogen or a halo, substituted or unsubstituted alkyl, substituted or unsubstituted cycloalkyl, cyano, hydroxy, alkoxy, carboxy, or ester group,
L is an organic linking group,
EWG represents an electron withdrawing group having a Hammett-sigma value greater than or equal to 0.35 such that the oxygen-carbon bond in O—C(EWG)($R_1$) is cleavable in the presence of a cleaving acid having a $pK_a$ of 2 or less as measured in water,
Ar is a substituted or unsubstituted arylene group,
X is $NR_2$ or oxygen,
$R_2$ is hydrogen or an alkyl group,
t-alkyl represents a tertiary alkyl group having 4 to 6 carbon atoms, and
m represents at least 10 mol % and up to and including 99 mol %, based on the total recurring units in the polymer.

2. The method of claim 1, wherein R, R', and R" are independently hydrogen, methyl, ethyl, or chloro, $R_1$ is hydrogen, methyl, ethyl, or halo-substituted methyl, X is oxygen, EWG represents a trifluoroalkyl group having 1 to 3 carbon atoms, a trichloroalkyl group having 1 to 3 carbon atoms, cyano, nitro, carboxylic acid, or a carboxylic acid ester, Ar is substituted or unsubstituted phenylene, and t-alkyl represents a tertiary alkyl group having 4 or 5 carbon atoms.

3. The method of claim 1, wherein EWG represents a trichloromethyl group or a trifluoromethyl group, Ar is unsubstituted phenylene, and t-alkyl represents a tertiary butyl group.

4. The method of claim 1, wherein L is a carbonyloxyalkylene group having 1 to 10 carbon atoms in the alkylene chain or a substituted or unsubstituted arylene group.

5. The method of claim 1, wherein m represents at least 10 mol % and up to and including 95 mol %, based on total recurring units in the polymer.

6. The method of claim 1 further comprising (b) recurring units comprising pendant groups that provide crosslinking in the presence of the cleaving acid having a $pK_a$ of 2 or less as measured in water.

7. The method of claim 6, wherein the (b) recurring units are present in an amount of at least 1 mol % based on the total recurring units in the polymer.

8. The method of claim 6, wherein the (b) recurring units comprise pendant glycidyl groups and are present in an amount of at least 1 mol % and up to and including 50 mol %, based on the total recurring units in the polymer.

9. The method of claim 6 further comprising additional (c) recurring units that are different from all (a) and (b) recurring units, wherein the additional (c) recurring units are present in an amount of at least 1 mol % and up to and including 50 mol %, based on the total recurring units in the polymer.

10. The method of claim 1, wherein R, R', and R" are independently hydrogen or methyl, $R_1$ is hydrogen or methyl, L is a carbonyloxyalkylene group having 1 to 10 carbon atoms or a substituted or unsubstituted arylene group, EWG represents a trichloromethyl or trifluoromethyl group, X is oxygen, Ar is a substituted or unsaturated phenylene group, and t-alkyl represents a tertiary alkyl group having 4 or 5 carbon atoms.

11. The method of claim 10, wherein EWG represents trifluoromethyl, Ar is an unsubstituted phenylene group, and t-alkyl represents a tertiary butyl group.

12. The method of claim 1, wherein the (2) compound is an arylsulfonium salt or aryliodonium salt that provides the cleaving acid having a $pK_a$ of 2 or less as measured in water.

13. The method of claim 1, further comprising:
heating the polymeric layer simultaneously or immediately after patternwise exposing the polymeric layer at a temperature sufficient to further generate sulfonic acid groups or sulfonate groups in the reactive polymer in the exposed regions of the polymeric layer.

14. The method of claim 1, comprising contacting the exposed regions in the polymeric layer with electroless seed metal ions selected from the group consisting of silver ions, platinum ions, palladium ions, gold ions, rhodium ions, nickel ions, iridium ions, tin ions, and copper ions.

15. The method of claim 1, comprising electrolessly plating with a metal that is selected from the group consisting of copper(II), silver(I), gold(IV), palladium(II), platinum(II), nickel(II), chromium(II), and combinations thereof.

16. The method of claim 1, comprising reducing the electroless seed metal ions in the exposed regions of the polymeric layer with a reducing agent that is a borane, aldehyde, hydroquinone, or sugar reducing agent.

17. A precursor article comprising a substrate and having disposed thereon a polymeric layer comprising a reactive composition that comprises:
(1) a reactive polymer comprising (a) recurring units in an amount of at least 10 mol % based on the total reactive polymer recurring units;
(2) a compound that provides a cleaving acid upon exposure to radiation having a $\lambda_{max}$ of at least 150 nm and up to and including 450 nm, which cleaving acid has a $pK_a$ of 2 or less as measured in water;
(3) a crosslinking agent that is capable of reacting in the presence of the cleaving acid, to provide crosslinking in the reactive polymer; and
(4) optionally, a photosensitizer,
wherein the reactive polymer comprises (a) recurring units represented by the following Structure (A):

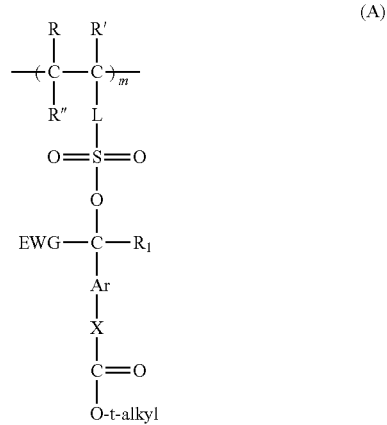

(A)

wherein:
R, R', and R" are independently hydrogen or an alkyl, cyano, or halo group,
$R_1$ is hydrogen or a halo, substituted or unsubstituted alkyl, substituted or unsubstituted cycloalkyl, cyano, hydroxy, alkoxy, carboxy, or ester group,
L is an organic linking group,
EWG represents an electron withdrawing group having a Hammett-sigma value greater than or equal to 0.35 such that the oxygen-carbon bond in O—C(EWG)($R_1$) is cleavable in the presence of a cleaving acid having a $pK_a$ of 2 or less as measured in water, Ar is a substituted or unsubstituted arylene group,
X is $NR_2$ or oxygen,
$R_2$ is hydrogen or an alkyl group,
t-alkyl represents a tertiary alkyl group having 4 to 6 carbon atoms, and
m represents at least 10 mol % and up to and including 99 mol %, based on the total recurring units in the polymer.

18. A product article comprising a substrate and having disposed thereon a polymeric layer comprising exposed regions and non-exposed regions,
the exposed regions comprising a pattern of electrolessly plated metal complexed within or deposited on the surface of a polymer comprising pendant sulfonic acid groups or sulfonate groups, which polymer has been derived from a reactive polymer, and
the non-exposed regions comprising a reactive composition that comprises:
(1) the reactive polymer comprising (a) recurring units in an amount of at least 10 mol % based on the total reactive polymer recurring units;
(2) a compound that provides a cleaving acid upon exposure to radiation having a $\lambda_{max}$ of at least 150 nm and up to and including 450 nm, which cleaving acid has a $pK_a$ of 2 or less as measured in water;
(3) a crosslinking agent that is capable of reacting in the presence of the cleaving acid, to provide crosslinking in the reactive polymer; and
(4) optionally, a photosensitizer,
wherein the reactive polymer comprises (a) recurring units represented by the following Structure (A):

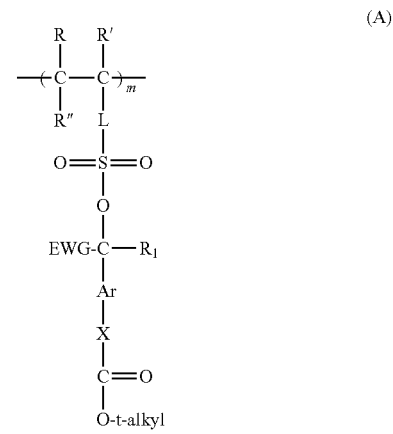

(A)

wherein:
R, R', and R" are independently hydrogen or an alkyl, cyano, or halo group,
$R_1$ is hydrogen or a halo, substituted or unsubstituted alkyl, substituted or unsubstituted cycloalkyl, cyano, hydroxy, alkoxy, carboxy, or ester group,
L is an organic linking group,
EWG represents an electron withdrawing group having a Hammett-sigma value greater than or equal to 0.35 such that the oxygen-carbon bond in O—C(EWG)($R_1$) is cleavable in the presence of a cleaving acid having a $pK_a$ of 2 or less as measured in water,
Ar is a substituted or unsubstituted arylene group,
X is nitrogen or oxygen,
t-alkyl represents a tertiary alkyl group having 4 to 6 carbon atoms, and m represents at least 10 mol % and up to and including 99 mol %, based on the total recurring units in the polymer.

* * * * *